(12) United States Patent
Viassolo et al.

(10) Patent No.: US 9,466,034 B2
(45) Date of Patent: Oct. 11, 2016

(54) RENEWABLE ENERGY CONFIGURATOR

(75) Inventors: Daniel Viassolo, Katy, TX (US);
Sridhar Sahukari, Houston, TX (US);
Gerald Murphy, Houston, TX (US);
Bo Hesselbæk, Kolding (DK); Jianhui Zhang, Houston, TX (US); Aditya Upadhye, Malvern East (AU); Yonatan Abebe, Houston, TX (US); Jason Hoffman, Alburtis, PA (US); Juan Santos, Katy, TX (US); Brett Rollow, Katy, TX (US)

(73) Assignee: Vestas Wind Systems A/S, Aarhus N. (DK)

( * ) Notice: Subject to any disclaimer, the term of this patent is extended or adjusted under 35 U.S.C. 154(b) by 708 days.

(21) Appl. No.: 13/460,360

(22) Filed: Apr. 30, 2012

(65) Prior Publication Data
US 2013/0030784 A1 Jan. 31, 2013

Related U.S. Application Data

(60) Provisional application No. 61/479,878, filed on Apr. 28, 2011.

(30) Foreign Application Priority Data

May 30, 2011 (DK) ................................. 2011 70268

(51) Int. Cl.
*G06F 9/45* (2006.01)
*G06Q 10/00* (2012.01)
*G06F 17/50* (2006.01)

(52) U.S. Cl.
CPC ........... *G06Q 10/00* (2013.01); *G06F 17/5009* (2013.01); *Y02E 10/763* (2013.01)

(58) Field of Classification Search
CPC ........... G06F 17/5009; G06F 17/5086; Y02E 10/766; Y02E 10/566; Y02E 10/763; G06Q 10/00
USPC .............................................. 703/18, 22, 13
See application file for complete search history.

(56) References Cited

U.S. PATENT DOCUMENTS

| 2008/0172279 A1* | 7/2008 | Enis ..................... F03D 9/005 705/7.25 |
| 2009/0295162 A1* | 12/2009 | Oohara .................... F03D 7/028 290/44 |

(Continued)

OTHER PUBLICATIONS

Costa, Luis M., et al.,"Management of Energy Storage Coordinated with Wind Power under Electricity Market Conditions", May 25-29, 2008, Proceedings of the 10th International Conference, Probabilistic Methods Applied to Power Systems, IEEE.*

(Continued)

*Primary Examiner* — Cedric D Johnson
(74) *Attorney, Agent, or Firm* — Patterson + Sheridan, LLP

(57) ABSTRACT

Embodiments for determining an optimal configuration for a renewable energy power plant are provided. The power plant, which may be a virtual power plant, includes one or more generator devices and one or more energy storage devices that may be operated to undertake one or more operating applications. Data indicative of the power output of the power plant and the voltage level at the energy storage system connection point is received as an input. Using this data, combinations of energy storage devices and operating applications stored on a database are processed and, for each energy storage and operating application pair, a value indicative of the profitability of undertaking the operating application is determined. These values are used to rank the combinations of energy storage devices and operating applications according to their profitability, which in turn is used to select the most efficient or profitable application/energy storage pair.

22 Claims, 10 Drawing Sheets

(56) References Cited

U.S. PATENT DOCUMENTS

| | | | |
|---|---|---|---|
| 2009/0319090 A1 | 12/2009 | Dillon et al. | |
| 2010/0076613 A1* | 3/2010 | Imes | G06Q 50/06 700/287 |
| 2011/0082598 A1* | 4/2011 | Boretto | G06Q 10/06 700/291 |

OTHER PUBLICATIONS

Chacra, Fouad Abou et al, "Impact of Energy Storage Costs on Economical Performance in a Distributed Substation", May 2005, IEEE Transactions on Power Systems, vol. 20, No. 2, IEEE.*

Castronuovo, Edgardo D. et al., "On the Optimization of the Daily Operation of a Wind-Hydro Power Plant", IEEE Transactions on Power Systems, Aug. 2004, vol. 19, No. 3, IEEE.*

Atwa, Yasser Moustafa et al., "Optimal Allocation of ESS in Distribution Systems with a High Penetration of Wind Energy", Nov. 4, 2010, IEEE Transactions on Power Systems, vol. 25, No. 4, IEEE.*

Denholm, Paul et al., "The Value of Compressed Air Energy Storage with Wind in Transmission Constrained Electric Power Systems", May 5, 2009, Energy Policy 37, Elsevier, Ltd.*

Kaldellis, J.K. et al., "Optimum Energy Storage Techniques for the Improvement of Renewable Energy Sources-Based Electricity Generation Economic Efficiency", May 30, 2007, Energy 32, Elsevier Ltd.*

Denmark Patent Office, Denmark Application No. PA 2011 70268 Search Report dated Dec. 20, 2011, 4 pages.

* cited by examiner

| | ES Technologies | | | |
|---|---|---|---|---|
| | Tech 1 | Tech 2 | Tech 3 | Tech 4 |
| Applications App 1 | Rank – 4<br>NPV – $0.3m | Rank – 2<br>NPV – $2.2m | Rank – 1<br>NPV – $3.0m | Rank – 3<br>NPV – $1.2m |
| App 2 | Rank – 2<br>NPV – $1.2m | Rank – 3<br>NPV – $0.5m | NA | Rank – 1<br>NPV – $2.0m |
| App 3 | Rank – 1<br>NPV – $3.9m | NA | NA | Rank – 2<br>NPV – $2.0m |
| App 4 | Rank – 4<br>NPV – $2.2m | Rank – 3<br>NPV – $2.8m | Rank – 2<br>NPV – $3.2m | Rank – 1<br>NPV – $3.8m |
| App 1 + 2 | Rank – 2<br>NPV – $3.1m | Rank – 3<br>NPV – $2.0m | Rank – 4<br>NPV – $1.2m | Rank – 1<br>NPV – $4.2m |

FIG 14

| Market | Market 1 | |
|---|---|---|
| Technology | Tech 1 | |
| Application | TS | |
| | A1 | A2 ... An |
| Size | | |
| NPV | NPV_TS_A1 | NPV_TS_A2 ... NPV_TS_An |

Size: ( P[MW]_E[MWh] )
NPV: $ million

| | Tech1 | | Tech2 | | Tech3 | | Tech4 | |
|---|---|---|---|---|---|---|---|---|
| | Size | NPV | Size | NPV | Size | NPV | Size | NPV |
| App1: TS | A1 | NPV_TS_A1 | | | | | | |
| App2: TC | | | | | | | | |
| App3: GFR | | | | | | | | |
| App4: TS+TC | | | | | | | | |

RENEWABLE ENERGY CONFIGURATOR

FIELD OF THE INVENTION

The present invention relates to a system for determining the optimum properties of an energy storage system for coupling to a renewable energy power plant.

BACKGROUND

There exist various methods and systems for devising and implementing control methods for renewable energy power plants. Such methods may, for example, determine the optimum time to produce and sell electricity in order to maximise earnings. However, such methods only allow optimisation of an existing system.

The problem arises that, even before a renewable energy power plant is constructed, one may not know what optimum arrangement to use, particularly when an energy power plant is to be coupled to an energy storage system.

SUMMARY

The invention is defined in the claims to which reference is now directed. Preferred features are set forth in the dependent claims.

Embodiments of the present invention relate to determining how a virtual power plant, comprising a simulated wind power plant and a simulated energy storage system, will perform when carrying out certain applications. Embodiments of the invention allow properties of the energy storage system (such as the technology used and the storage size) and/or of the wind power plant (such as the number of wind turbines and their rated power), or the control methods of either of these elements, to be changed to determine the most cost effective and/or efficient virtual power plant combination. As a result, a user can determine the most appropriate energy storage system to use for a proposed wind power plant, or the most appropriate energy storage system to use for an existing wind power plant, at a given location. Embodiments of the invention may also include the steps of constructing a wind power plant and energy storage system combination at the investigated location, or constructing an energy storage system at a pre-existing wind power plant, based on the data output by the method or system provided by the invention.

The system, referred to as a configurator, is a computer implemented system that outputs data indicating which electricity application can be paired with which energy storage systems or apparatus to yield the optimal results for a particular location. Preferably the data is output in the form of a data report. An electricity application (henceforth simply an "application") is an application, or method of operation, of a power plant, utilizing both the generator and the energy storage system, to achieve a particular goal. Examples of applications that will be described in more detail below include time-shifting, transmission curtailment, grid frequency regulation, combinations of time shifting and frequency curtailment, forecast accuracy and firm capacity. The "optimized" results determined by the configurator are typically the wind power plant/energy storage technology pair that provide the highest financial return, although other parameters may be used, and in turn relate to the most efficient coupling of the generator and energy storage and/or the most efficient control method of both or either component, for a given application and particular electricity price point. This may be qualified, for example, as the profit generated for a particular arrangement of generator, storage device and control logic, or as the highest net present value (NPV) or net present worth (NPW) or a similar value indicative of the cost of an installation, the cost of operation and generated income from selling generated electricity.

The output of the configurator may be a ranking of all technically feasible application/energy storage technology pairs based on their estimated NPV as determined by the configurator. Optimal energy storage sizes and control system methods may also be provided with the output results.

The system operates based on input received for a specific power plant, which may be a proposed power plant that has not yet been constructed. Various simulated models for particular applications and energy storage systems/technologies are used, their inputs being dependent upon the system input data.

Embodiments of the invention may provide a computer implemented method for determining an optimal configuration for a renewable energy power plant. The power plant, which may be a virtual power plant, comprises one or more generator devices and one or more energy storage devices that may be operated to undertake one or more operating applications. Data indicative of the power output of the power plant is received as an input and used to process combinations of energy storage devices and operating applications stored on a database to determine, for each energy storage and operating application pair, a value indicative of the profitability of undertaking the operating application. The combinations of energy storage devices and operating applications are then ranked according to their profitability.

The voltage level at the energy storage system (ESS) connection point, or a value indicative thereof, may also be provided as an input.

Preferably a value is determined, using the received input data, for each energy storage device and operating application pair, the value being indicative of the profitability of undertaking the operating application for a plurality of different capacity values for the energy storage device. The combinations for different capacity values may then also be ranked to determine the optimum capacity value for a given storage device type.

Preferably data indicative of the location of the grid to which the power plant is, or is to be, connected is received as an input, the method further comprising comparing the technical operating requirements for the grid with the technical operating requirements of the one or more operating applications to determine whether they are compatible, and removing from further consideration any incompatible operating applications. This may be achieved by assessing data from the grid code of a particular location.

The method may also preferably further comprise the step of receiving, as an input, data indicative of the location of the grid to which the power plant is, or is to be, connected and comparing the technical operating requirements for the grid with the technical requirements of the one or more energy storage devices to determine whether they are compatible, and removing from further consideration any incompatible energy storage devices.

The method reveals the energy storage type/technology and size with the highest profitability value for a particular application and allows this energy storage device to be selected.

A corresponding apparatus may be provided for determining an optimal configuration for a renewable energy power plant, the power plant comprising one or more generator devices and one or more energy storage devices that may be operated to undertake one or more operating applications. The apparatus comprises an input terminal, for receiving data indicative of the power output of the power plant, and a processor for processing, using data received at the input terminal, combinations of energy storage devices and operating applications stored on a database. The processor can determine, for each energy storage and operating application pair, a value indicative of the profitability of undertaking the operating application. The apparatus is further arranged to rank the combinations of energy storage devices and operating applications according to their profitability and includes an output for outputting the ranking.

Embodiments of the invention may provide a computer implemented method, and corresponding apparatus, for comparing the properties of a plurality of energy storage systems for a renewable energy power plant. A simulator is provided comprising a plurality of energy storage system models that model an energy storage system type; data indicative of the power output of one or more renewable energy power plants; one or more application models that model an operating application of a combination of a renewable energy power plant and associated energy storage system; and a calculation module for performing simulation calculations. Input data indicative of the power output of the renewable energy power plant is received and a simulation is run, on the calculation module, of a renewable energy power plant and associated energy storage system according to an application based on the input data. The energy storage system models, the power output data and the application models output one or more simulation results indicative of the performance of an energy storage system and application combination. The performance of a first combination of energy storage system model and application model are then ranked against one or more further combinations.

Preferably the simulator, or a post processing module, calculates a parameter indicative of the profitability of a plurality of combinations of ESS models and applications and this is used to rank each combination. The parameter is preferably the net present value (NPV) of the energy storage system and renewable energy power plant operating according to the selected application.

Preferably the method includes the step of performing a plurality of simulations for a given combination of ESS model and application model using different capacity values for the energy storage system and ranking the results. The optimum ESS capacity can be determined by calculating a measure of profitability of each size of ESS for a given combination and ranking the results for each combination.

The method may further include the step of receiving data indicative of the location of the power plant and, prior to providing input data to the simulator, determining which applications are compatible with the grid code requirements for the location and the renewable energy power plant type being considered and removing incompatible applications from further consideration. The determination may be based upon price information, grid information and/or local wind information. The method may also, or instead, further comprise the step of, prior to providing input data to the simulator, determining which ESS types are able to meet the technical requirements of the application by comparing the application requirements with predefined ESS parameters and removing incompatible applications from further consideration.

The corresponding configurator apparatus may comprise one or more memory modules having stored thereon a plurality of energy storage system models that model an energy storage system type; data relating to the properties of one or more renewable energy power plants; and one or more application models that model an application of the renewable energy power plant and associated energy storage system. The apparatus also comprises a simulator core/calculation module comprising a processor, for running simulations using the models and renewable energy power plant data; an input for receiving data indicative of the power output of the renewable energy power plant; and a post processing module arranged to output one or more simulation results indicative of the performance of an energy storage system and application combination for comparison of a first combination of energy storage system model and application model with a second combination, and further arranged to rank the performance of a first combination of energy storage system model and application model against one or more further combinations.

The apparatus may further comprise an application selector and associated database, the application selector being arranged to determine, prior to providing input data to the simulator, which applications are compatible with the grid code requirements for the location and renewable energy power plant type based on data stored in the associated database and to remove incompatible applications from further consideration. The determination may be based upon price information, grid information and/or local wind information. The apparatus may further comprise an ESS selector and associated database, the ESS selector being arranged to determine, prior to providing input data to the simulator, which ESS types are able to meet the technical requirements of the application by comparing the application requirements with predefined ESS parameters stored in the associated database and removing incompatible applications from further consideration.

A computer program may also be provided which, when operated on a computer, causes it to undertake any of the methods described herein.

BRIEF DESCRIPTION OF THE FIGURES

Examples of the invention will now be described in more detail with reference to the drawings in which:

FIG. 14 shows an example template of a final scorecard for ranking ESS/application pairs.

DESCRIPTION OF PREFERRED EMBODIMENTS

Although embodiments of the present invention may find application for any form of power plant, the embodiments below will be discussed in relation to renewable energy, and particularly wind power plants which comprise a plurality of wind turbine generators.

1) Overview

Figures 1, 3:
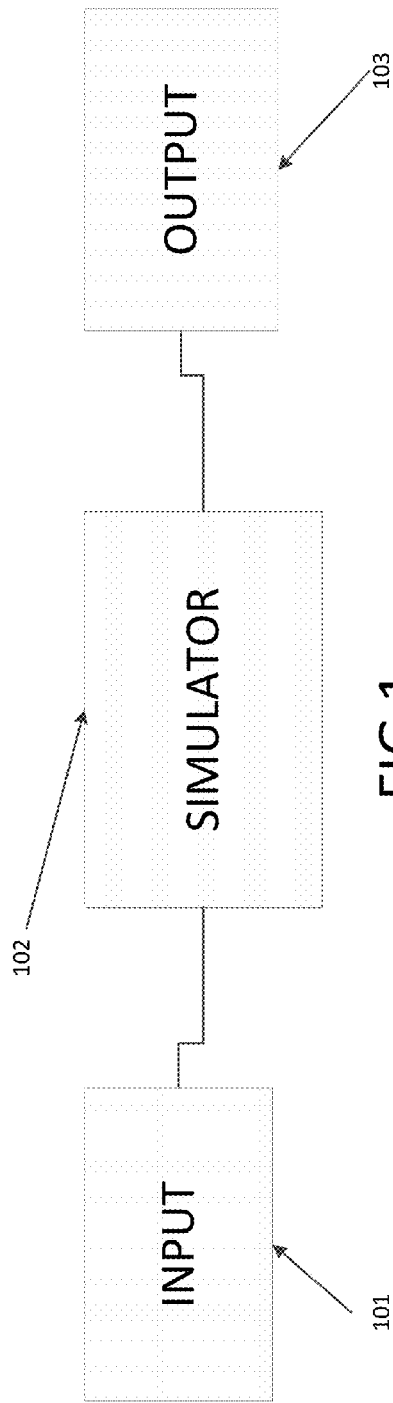
FIG. 1 shows the general overall arrangement of an embodiment of the invention.
FIG. 3 shows an example output scorecard for ranking results of the configurator system.

As a basic overview, FIG. 1 shows how embodiments of the invention may be implemented. An input section 101 provides the necessary input data to a simulator section 102. The simulator section uses logic models to simulate energy storage technologies and applications, the simulation parameters being based on the input data. The simulation results are provided to an output where further processing of the simulation data may be performed.

Figure 2:
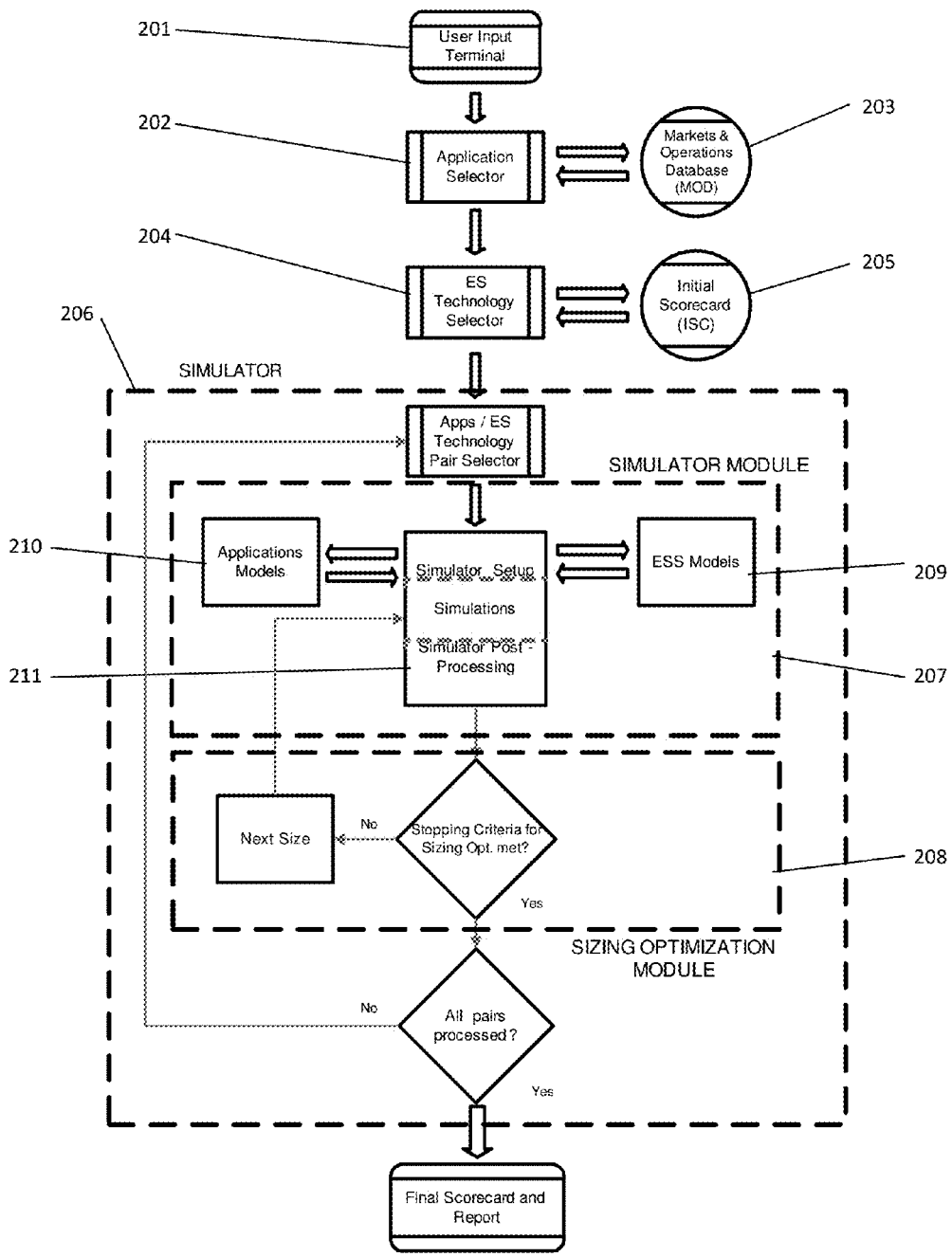
FIG. 2 shows the processes and information flow within the configurator system.

FIG. 2 shows a configurator system according to an embodiment of the present invention, along with the data flow within the system starting from user input up to final data output. The configurator is comprised of a number of modules adapted to perform specific functions, and these are schematically indicated in FIG. 2.

Input is provided to the simulator 206 from an input section that comprises a user input terminal 201, an application selector 202 and an energy storage technology selector 204. The inputs provided to the simulator 206, one or more of which may be provided by the user, include the wind power plant location, size, the voltage level at the energy storage system (ESS) connection point to the wind power plant, and/or the power that can be provided to the ESS for charging purposes. The wind power plant location may be specified as a place name, such as "New England", or more specifically as "Boston, New England", or using any other location specifying method such as longitude/latitude or GPS (or other satellite positioning system) coordinates. The wind power plant size, being indicative of power output such as a rating of the maximum or average power output for example, may be specified as the total number of units (i.e. total number of wind turbine generators) along with the rated power of each unit, as the total power rating of the wind power plant in MW, or in some other manner. The ESS voltage level may be specified in kV, and is preferably the ESS voltage level at the point of common coupling between the turbines within the power plant. The ESS voltage value is dependent upon the type, or types, of turbine used in the power plant, and the power plant design, as well as the geographic location of the power plant. The input data may alternatively be obtained from a database, such as database 203; the user may select or specify a location and the power output of an existing wind turbine (or previously proposed wind turbine) may be extracted from the database, as may the local ESS voltage level for that location or wind power plant arrangement.

The input may also include further optional data from the user, such as wind series data (the variation of wind properties, and particularly speed, over a specified time), in m/s or MW, at the location of the wind power plant (WPP). This data may be obtained from direct measurement using a wind speed detection system. Additional optional data may also include the transmission network/profile capacity at the location, location specific price series data for various applications and information regarding operation of the local transmission network of the power plant. Alternatively some, or all, of this data may be provided in a database, such as markets and operations database 203, and linked to the location specified such that the relevant information can be called upon from the database once the wind power plant location has been specified. The database is preferably updateable from a data source so that additional or revised location specific information can be input and stored.

The application selector 202 and database 203 are used to narrow down the possible feasible applications based on the location of the WPP, which may be determined relative to the properties of the transmission network, or the requirements put in place by the grid controller. This filter also considers technical requirements for the given area such as specific grid code requirements, for example LVRT (Low Voltage Ride Through), frequency deviations, and capacity dispatch requirements that make the technology viable. The remaining applications, as determined by the application selector module based on data stored in the associated database, may be fed to the energy storage selector 204. The energy storage selector filters out energy storage technologies that are not compatible with particular applications in a given location. This analysis is based on logical and mathematical analysis to derive the ESS total costs. The operation of the application and ES technology selectors can be explained as follows: different electricity grids, or different markets, have different technical requirements of the power plants connected to them; the application selector and ES technology selector modules are provided to exclude the applications and ES technologies that do not meet the grid technical requirements, such as the requirements as specified in the relevant grid code.

After the initial coarse filtering stage of the application selector/ES technology selector to determine potentially viable application and energy storage (ES) pairs, each remaining pair is provided to the simulator system 206. The simulator system (or "simulator") contains a simulator module 207 which contains separate application and ESS model modules. The simulator assesses each application/ES technology pair, for different capacities of the ESS, and optimizes the size of the ESS for the associated application by maximising or minimising a particular variable. For example, for a particular wind power plant/ESS pair, the simulator may vary the ESS size or capacity until the associated NPV value is maximised.

When all the relevant pairs have been processed the simulator outputs the ES technologies in a ranking for each of the proposed applications. These rankings are preferably based on estimated NPV values, computed via time domain simulations performed by the simulator. The output may be in the form of a scorecard, an example of which is shown in FIG. 3. Additional outputs may include the ES optimal size and the control strategy used in the simulation.

As a result of the configurator operation, the user is provided with data that indicates which storage technology and preferably also which size, or capacity, of a given storage technology type would be the most efficient, or yield the highest financial return, for a particular application. A power plant can be constructed at the location of interest using the most efficient, cost effective, and/or profitable ES technology determined. Alternatively, the most efficient, cost effective, and/or profitable ES technology may be determined for an existing WPP.

There will now follow a more detailed description of the various elements of an embodiment of the present invention.

2) User Input

The user input module 201 may be in the form of computer terminal for receiving data from a user. In one embodiment the user may select a location from a list of possible locations for which the relevant data has been obtained. The user may input the number of wind turbine generators (WTG) proposed for the new power plant, along with the type of wind turbine generator proposed for use and the location of the wind power plant (WPP). More than one type of WTG may be used, in which case the user would specify the number of each type of WTG. The location information is used to determine or look up data relevant to the particular location and may be specified by the user as described above. Alternatively, the user could enter the relevant data such as the voltage level of the ESS connection point or distance to the transmission network.

As mentioned above, the user may additionally enter the wind production capability for a proposed site, being time series data that represents the power generation capability of the WPP. Alternatively, this could be retrieved from an updateable database 203.

3) Application Selector and Database

The application selector module 202 is used to identify the applications that are suitable for a particular WPP project. The application selector contains logic for determining which applications are compatible with a given location and WTG type. The logic uses data stored in the database 203 to narrow down the possible applications from all available in a specific location/market to those that should be investigated further.

The logic may be programmed to exclude applications from further consideration based upon price information, grid information and/or local wind information such as, respectively, market structure, transmission network and operations profile and wind production capability and accuracy of forecast. The data is preferably series data, indicative of how the price, grid or wind information varies over a particular time period. The wind data may preferably include the date, wind speed and power over a particular period for a particular location of interest, for example in the region of markets 1, 2 or 3. The price data, which may include LMP (Locational Marginal Price) and RCP (Regulation Clearing Price), may be obtained from the corresponding ISO (Independent System Operator) for a given market, for example by download from a corresponding ISO website. The grid data is the information sent from the grid and may include the Curtailment data required for the Transmission Curtailment application, Frequency and AGC signal required for GFR application as well as Forecast Error data required for the Forecast Accuracy and Firm Capacity applications. Although any of this data may be stored in the database 203, it may instead be provided directly by the user. The specifics of this data will be discussed below.

The application selector may be arranged to exclude from further consideration those applications that require a power plant of a particular size. For example, certain applications may require a power plant of 20 MW and above. If the power plant being considered cannot provide this amount of power, such applications will be removed from further consideration by the application selector.

As a further example, the application selector module may begin with all possible applications as a starting point. The transmission network profile, such as network reliability or the amount of congestion as determined, for example, from an average zonal locational marginal price, may then be used to exclude certain applications. Operational patterns can also be used such as generation dispatch patterns or load profiles (e.g. Winter peak or Summer Low/minimum loads). Using these parameters, the applications are filtered into a next level to be investigated further depending upon the wind production capability profile and accuracy of forecast at the proposed location of the WPP.

As a further example, the WPP may be required to comply with a specific code, also known as a grid code, by a controlling entity responsible for the operations of the electricity delivery grid. The grid code may specify connection requirements, operating requirements and other technical requirements that a power plant connected to a particular grid must satisfy. The grid code may also specify the technical requirements needed when a power plant is involved in, or undertaking, certain applications. Failure to satisfy the grid code requirements may result in sanctions such as a monetary fine. The application selector may contain the grid code requirements for a particular location or grid, stored in the associated database, and may exclude applications for which a particular WPP arrangement would not be able to meet the technical requirements of the grid code. One specific example is that of low voltage ride through (LVRT). A wind turbine power plant may be required to be capable of performing LVRT when the voltage in the grid is temporarily reduced due to a fault or load change in the grid. The requirements of LVRT behaviour is specified in grid codes issued by the grid operator such as, for example, the UK National Grid code. Depending on the application the WPP may, during and after the dip, be required to:

disconnect temporarily from the grid but reconnect and continue operation afterwards;
remain operational and not disconnect from the grid; or
stay connected and provide reactive power.

If a particular wind power plant design is not technically capable of performing this function whilst carrying out a particular application, that application will be excluded from further consideration.

4) Energy Storage Technology Selector

The ES Technology Selector module 204 takes the selected applications from the Application selector module as its input. A second database 205 is provided, although this could be linked with, part of, or integral to, first database 203, and stores data relating to various ES technologies (type of battery or other storage technology) that can be used for WPP related applications. The main functionality of the ES Technology Selector module is to give an initial filtering of the ES technologies for all the given applications.

The selection of the ES technologies is based on the capability of the ES technology to meet the technical requirements of the application and the relevant grid code. For example, the application or grid code may require an ES technology with a certain storage capacity or power delivery size, and the ES technology selector may be arranged to exclude from further consideration those ES technologies that cannot meet this requirement. The verification of technical capability for the ES technology is preferably done by comparing the application and/or grid code requirements with the predefined ES technology parameters such as Response Time(s) and Full Power Discharge Duration(s).

Geographic requirements may also be used to select ES technologies; for example, a particular energy storage system may be capable of performing adequately in a land based environment but not at sea. The requirements that an ES technology must meet for a given application may be stored in the associated database for a given grid.

In addition to, or instead of, technological requirements of the energy storage technology, the ES technology selector may select or exclude technologies from further consideration based on the cost effectiveness of the storage means. The total cost of the storage technology may be taken into account, preferably over the complete lifetime of the WPP. A mathematical formula for the total cost may be obtained as a combination of performance indicators such as capital expenditure (CAPEX) and operating expenditure (OPEX) costs, which also takes into account the replacements necessary for the ES technology media as well as any required power conversion system. The module may also provide the sensitivity analysis as well as the confidence level of the proposed ES technologies with respect to the applications. A rank may be given for each Application—ES Technology pair based on the total cost which may take into account the confidence level associated with the technical cost specifications for each pair. The ranking may be used to exclude certain ES technologies from further consideration because they do not meet a minimum total cost threshold, or may exclude all but a predetermined number of top ranked technologies, such as the top 5 or top 10 ranked technologies.

5) Output Ranking Matrix and Reports

The input data is provided to a simulator, which simulates the operation of a WPP in a particular location with various ESS technologies according to control logic applicable to various applications. The data is then output for display to the user. This may be in any suitable display form, but may, in particular, be in a ranking that indicates the best ESS technology for a given application.

An example of a final ranking matrix or score card is shown in FIG. 2. As can be seen from the figure, each application-ES technology pair is given a ranking based on the calculated NPV, which is obtained from the simulator, and can be used to populate a table of the format shown in FIG. 2. In the format shown in FIG. 2, the ES technologies simulated and analysed by the configurator are shown, giving a ranking for all the technically feasible pairs of ES technology and applications. The cells indicate the final calculated NPV value, and indicate where certain combinations of ES technology and application are not technically feasible.

Figure 4:
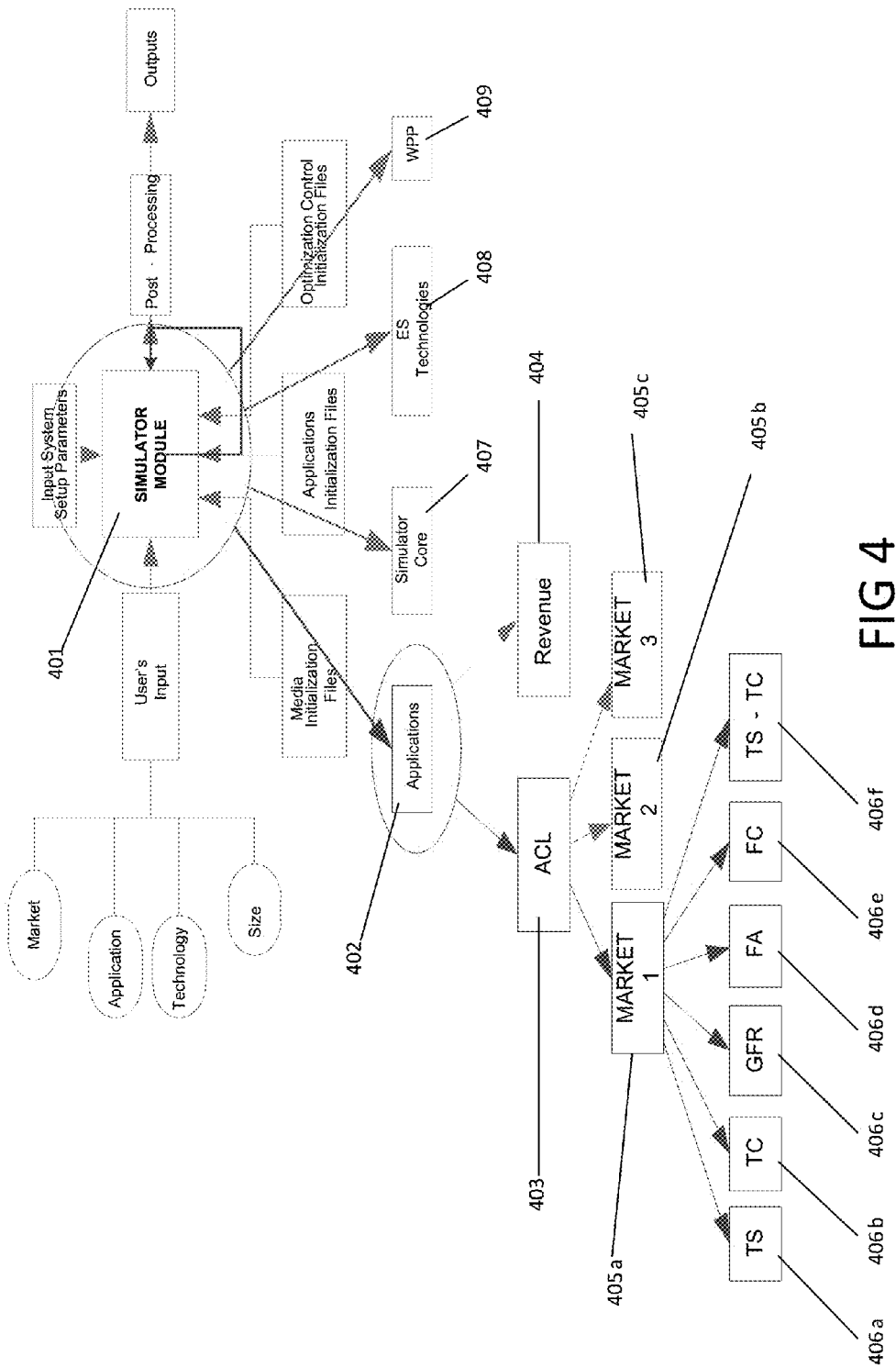
FIG. 4 shows the overall main structure of part of the simulator according to an embodiment of a configurator system.

A report may also be generated containing all the relevant input information, study assumptions and output information. In particular, the report may indicate:

The size and type of ESS (Power in MW, Energy in MWh)
List of applications
Market applicable
Control strategy for the operation of ESS in tandem with the WPP
NPV calculation The report may also provide all the input data provided by the user at the specific WPP. It may also include the default values considered for the calculation which ever are not provided by the user such as:

Price series data
Life time and efficiency of the ES media
Assumptions in the applications selected
Assumptions of the market structure
Assumptions related to the wind production forecast
Assumptions related to the grid operations 6) Simulator The simulator 102/206 will be described with reference to FIGS. 2 and 4. FIG. 2 shows the overall main structure of a configurator system, FIG. 4 shows the logical or software components of part of the simulator at the point at which the grid or market, the application, the ES technology and the ES size for simulation have been set. As shown in FIG. 4, input data and initial parameters are entered into the simulator module 401. The input may be provided from the ES Technology Selector in the form of selected application—ES technology pairs, or the input may be provided by some other means, such as directly from the user. In this way, in embodiments of the invention, the simulator could be used independently of the application and technology selector modules if required.

The simulator, provides an integrated tool for analysis and design of energy storage systems for renewable, and particularly wind, power applications. The simulator may integrate the following:

I. A WPP model, or wind farm production data and ESS model with a supervisory control algorithm for a given application.
II. The simulation results with a final economic analysis.

The simulator allows assessment to be made of efficiency and profitability for various ESSs, and allows ESS designs to be determined prior to expensive field demonstrations or full installation. In some embodiments, the simulator may be implemented as a set of application specific integrated circuits (ASICs), each simulator module comprising one or more ASICs. However, preferably the simulator is implemented in software operating on one or more processors within a computer system. The simulator elements may be implemented in MATLAB (matrix laboratory), but other programming languages/environments could be used or incorporated, as could modules developed in other languages such as C, PSCAD, etc. The simulator is implemented in a decentralized modular fashion, which can simplify maintenance, updates and communication. The modular and decentralized construction of the simulator allows a "plug-and-play" type system. Modules can be changed or upgraded for improvements of additional options. For example, the ES model could be selected from a library of ES models, including models such as Li-ion, NaS or VRB batteries, flow batteries or other types of energy storage device such as one or more flywheels.

The simulator allows development of the necessary modules using a universal architecture which does not change depending on the selected application or ES technology. For example, the same overall architecture can be used for forecast accuracy improvement using li-ion batteries as is used for arbitrage using another form of storage technology.

The simulator module 207/401 contains various sub-modules/components; namely the ESS models module 209/408, the application models module 210/402, and the simulator core or calculation module 211/407. The simulator core itself consists of a simulation set up module, a simulations module, and a simulator post processing module. The simulator core interacts with the ESS models module at each simulation step, and while doing so retrieves information from the ESS models module such as state of charge (SOC) percentage of a given ESS, power output from a given ESS (MW), and ES remaining life percentage. The simulator preferably generates power output versus time or energy versus time data, as well as other profiles such as state of charge versus time, remaining ESS life versus time, for example. The simulation core may also retrieve data used to determine the operating cost of the ES technology whenever there is a new ES technology considered for simulation. This may include capital expenditure ($/MWH, $/MW), operating expenditure ($/MWH, $/MW), and/or balance of plant costs which may originate mainly from power conversion systems and switch gear (the substation equipment used to connect the power plant to the transmission grid). The simulator core may also send information to the ESS model module. In particular the initial parameter values, such as ES size (maximum stored energy in MWH, or maximum power in MW), voltage of ESS connection (kV), initial state of charge percentage and initial ES life percentage, every time a new ES technology selection occurs, as well as providing values such as ES power reference (MW) for every time step in the simulation.

The wind farm, or WPP, model module 409 (not shown in FIG. 2), which could be replaced by any other renewable energy power plant model module, is arranged to provide the simulation with wind farm production data (MW) versus time. This module preferably contains a mathematical model of a wind farm, the model inputs including wind speed, commanded wind farm power level, and the power curve (being a parameter of the model). The model outputs to the simulation include the wind farm power. Alternatively, embodiments of the Configurator System may not require a detailed WPP model. The model may instead assume that the output of the WPP is the same as, or some function of, the wind energy capacity determined from the wind series data or the WPP reference given by the ACL or the simulator core Optimization block. Alternatively the wind farm simulation may utilise recorded data from an existing WPP.

During the simulation set up process, the simulator core sends a request to the applications model module for the application controller to be used during the simulation, as well as the necessary revenue equations applicable to a given application. Once the simulator core has acquired all the information about the ES technology being considered and the application being studied the simulation can run and the output data can be calculated. As part of the post processing, a net present value (NPV) may be calculated for every pair of application and ES technology and for all simulated ES sizes.

As well as determining one or more performance values for a given ES technology and application pair, the simulator preferably includes a sizing optimization module 208 (not shown in FIG. 4). The sizing optimization module 208 calculates the ESS size (power and/or energy size) that maximizes the NPV of a particular ES technology/application pair based on any suitable optimization technique, and preferably a two dimensional optimizing technique. The sizing optimization module may be located within the simulator module, as part of the simulator core post processing module, or may be part of a separate processing module as shown in FIG. 2. Where the output from the simulator is a scorecard or table, the highest NPV value can be used to populate the scorecard/table. The simulations are run until all application—ES technology pairs provided by the ES technology selector module are processed. The ranking of the various pairs is based on the NPV calculation mentioned above, with the pair having the highest NPV awarded the highest ranking score (e.g. a score of one) and the scoring continues for various pairs considered.

Figure 5:
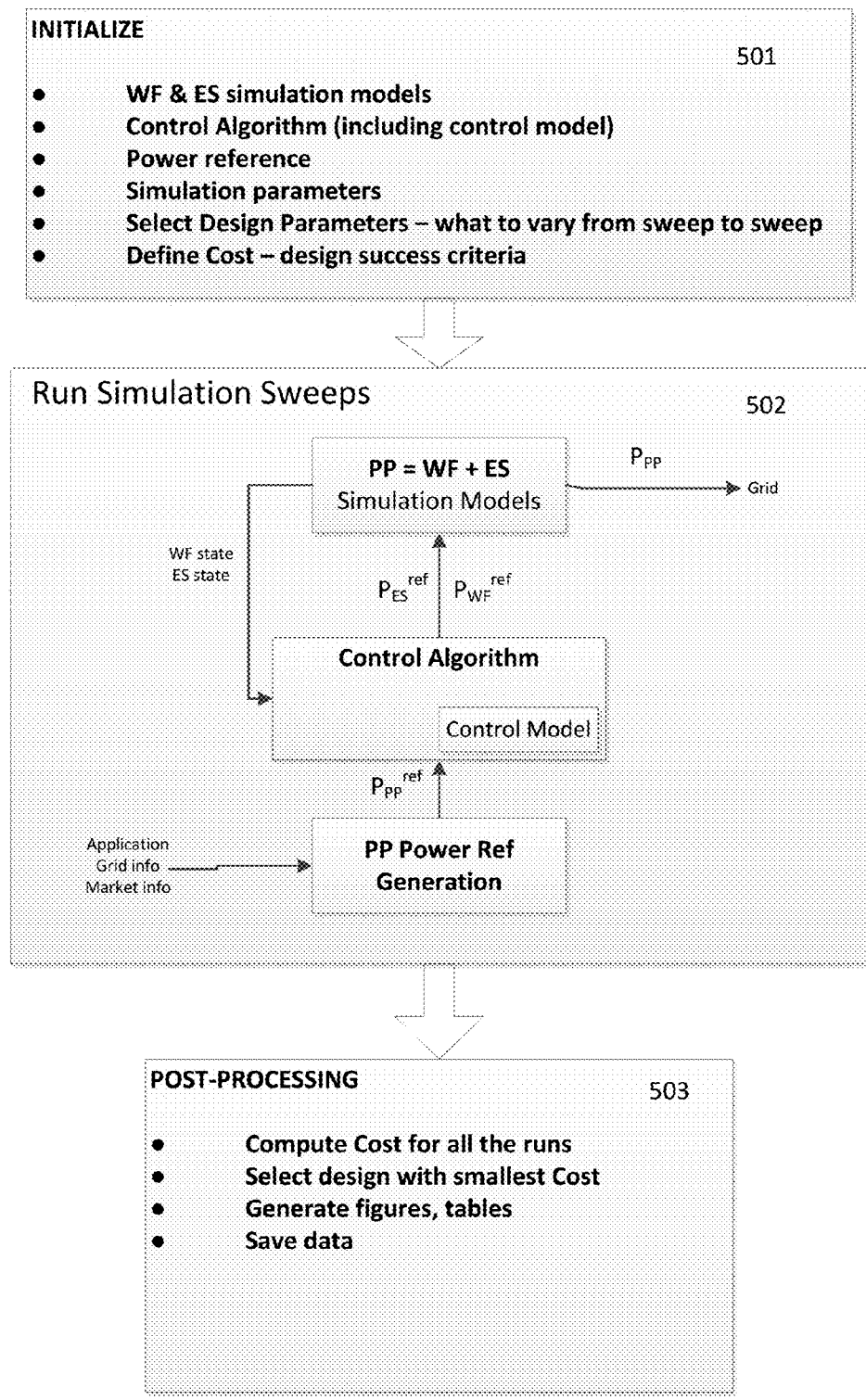
FIG. 5 shows the main steps undertaken by the simulator.

FIG. 5 shows the three main steps undertaken by the simulator in the chronological order in which they are performed. During the initialization process 501 selections are made for various parameters and features. The application (e.g., production shift, forecast accuracy, curtailment etc) for which a simulation is to be performed is selected from the available models along with the simulation models to be used for the ESS and WPP. The control algorithm type, including the control models for the WPP and ESS is also selected along with the design parameters, being the parameters that can be varied to find the optimal overall system in terms of most efficient energy storage or lowest cost for example, and the design criteria, being the criteria that indicates a successful system, such as a cost below a predetermined threshold or an efficiency rating above a predetermined threshold. The simulation parameters are selected, including sampling time, maximum simulation time and the numerical solver method, along with any other parameters or models required such as local electricity price, ESS price structure ($/MW or $/MWh).

The simulation stage then occurs at step 502. The simulator combines the selected models (wind farm/WPP, ESS, and Control Algorithm) and runs the simulation. During the simulation a number of iterations, or sweeps, are performed wherein the possible design parameters are varied as defined during the initialization step and the simulation results are output.

Subsequently, the post processing stage occurs at step 503, during which the optimization criteria for the sweeps are computed and used to select the design that best matches the selected successful criteria at the lowest cost. The data may be output in the form of a table or other suitable display.

Figure 6:
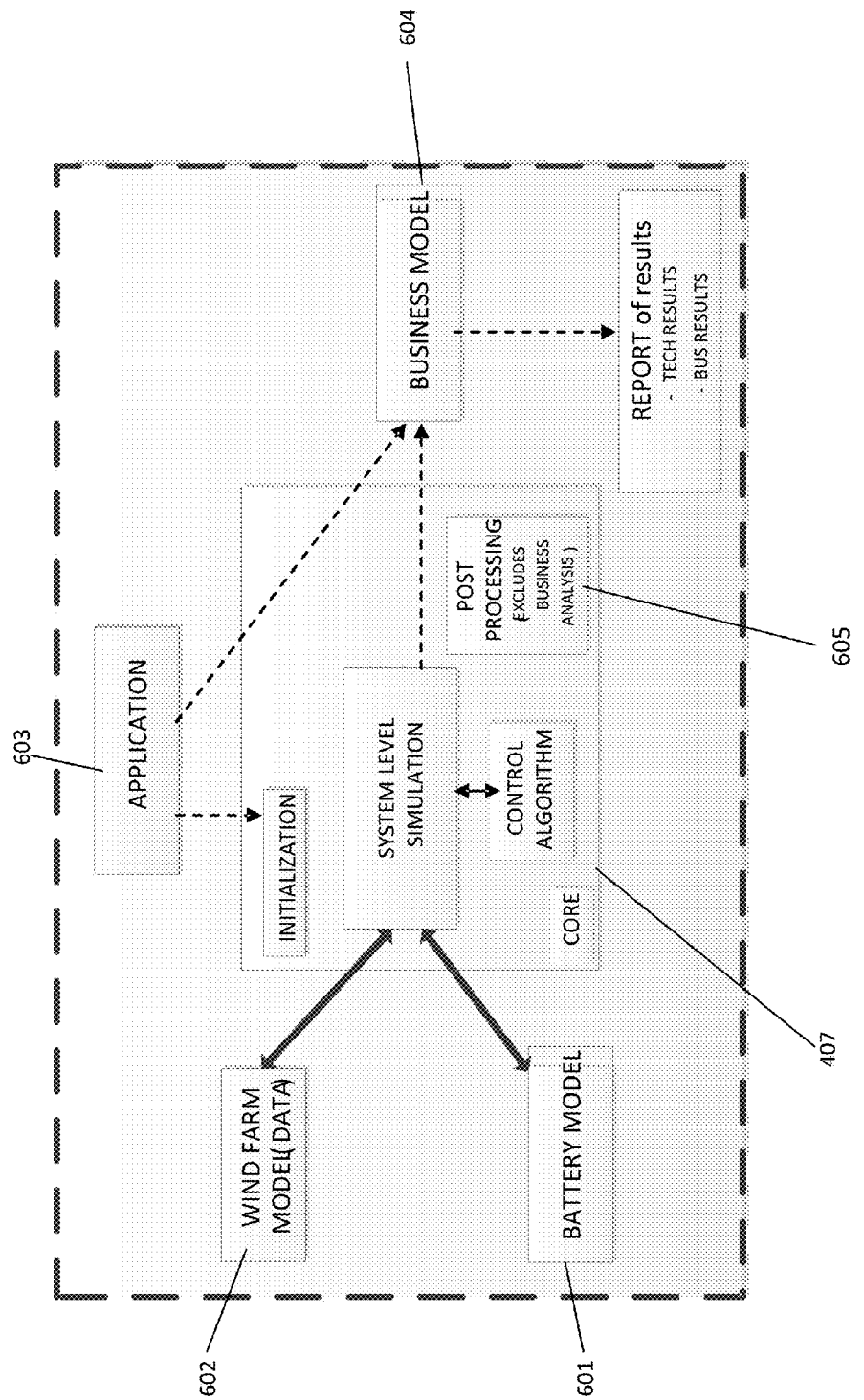
FIG. 6 shows the modular architecture of the simulator module used in embodiments of the invention.

FIG. 6 shows the modular architecture that constitutes the basic arrangement of the simulator and how the various modules may interact. The simulation core 407 receives input from the various other modules, and also provides output to some of these modules. In particular, the simulator core module exchanges information with the ESS/battery model module 601, a WPP or wind farm model module 602, application model module 603 and a business model module at 604.

The business model module 604, which may be part of a post processing module, receives simulation data and performs the analyses needed to obtain and determine the economic matrix used to evaluate the cost effectiveness of the selected ESS. Inputs to the business module include inputs from the simulator core, including time series coming from the simulations (power versus time for the wind farm, energy storage and power plant), the number of batteries used over the wind farm lifetime and other information for the operating expenditure and capital expenditure. The business model module also receives inputs from the application module 603 including electricity prices, projected increase rate of electricity prices and reward/penalty structure provided by the grid authority for a given application. The business model module can output revenue (rewards and penalties), cost (CAPEX, OPEX), profit and net present value.

Figure 8:
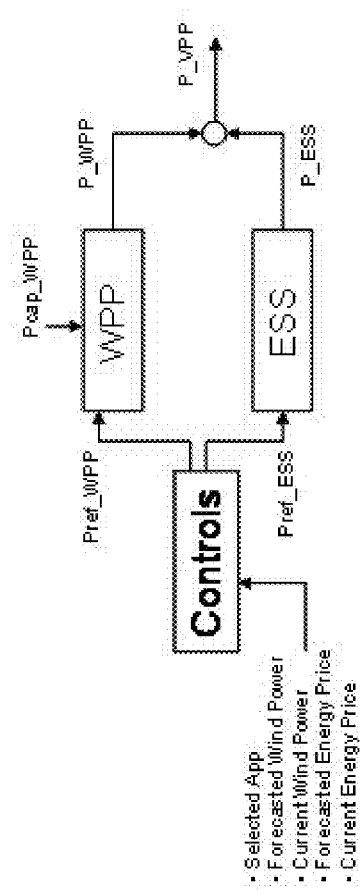
FIG. 8 shows the overall logical manner in which a simulated WPP and ESS are controlled when participating in an application.

The simulator core 407 includes the control algorithm(s) used to operate the ESS and WPP and also performs other functions such as model initialization and initial post processing of simulation data. The control algorithm module is arranged to coordinate the operation of the energy storage system with the wind farm such that the application objectives are met. The control algorithm may also have other goals such as maximizing the possible life span of the energy storage systems and/or the WPP. An example of power production using control algorithms for a selected application is illustrated in FIG 8.

The application module 603 provides the application parameters required for the simulation during the initialization phase. The application may be specified by the user from a predefined menu of possible applications, or may be suggested by the system as determined by the ES technology selector module 204. Examples of the application parameters include forecasted production profile, curtailment times and levels, production shift conditions and so on. These parameters differ through different applications of the wind farm and ESS. The application module may also contain the rules or policies for economic reward and penalty for a given application, which may be determined by the local power supply controlling entity or grid code. These rules can be passed to the business model module for a full evaluation to determine the most cost effective and efficient ESS for a particular application in a particular location. It should be noted that dashed lines in FIG. 6 indicate where information is not continuously shared during the simulation, but only at initialization.

Depending on the requirements of the user, the simulation is run for a stipulated simulation time and then results are computed and processed by post-processing module 605. Outputs are then generated and made available for the user. The Configurator system may contain separate sets of data for selected periods.

The simulator is preferably a computer implemented system comprising a number of files stored in one or more memory units or devices and one or more processors for performing the simulation calculations. It encompasses all the ES Technology, ES Applications and Optimization models. In a preferred embodiment, implemented using Matlab (matrix laboratory) software, the simulator is called upon by a Matlab m-file depending on the selection of the Market, Application, Technology and Size of the ESS.

The file structure of the configurator simulator module may mainly be divided into four main blocks as shown in FIG. 4. These blocks are:

Application Models (including Application Control Law & Revenue Calculations)
Simulator Core/calculation module (including real-time optimization based control)
ES Technology Models
Wind Power Plant (WPP) Model The system architecture is developed in a modular way which allows users and developers to enhance the system by adding new ES Technology or Application models in a simple plug and play manner by inserting a new file in the appropriate location or block. Due to its structure, it is also possible to improve the accuracy and confidence levels of the Configurator System by replacing generic models for the ES Technology, WPP, and Applications with more specific models based on the location of the WPP and ESS.

The configurator is equipped with various ES Technology models and diversified Application models. Thus it is important that the simulations are run in an optimal way to achieve accurate results in a short amount of time. In order to meet these two conflicting requirements, the simulator may be programmed to run blocks of the simulator at different speeds. In particular, two different time steps may be provided.

Figure 7:
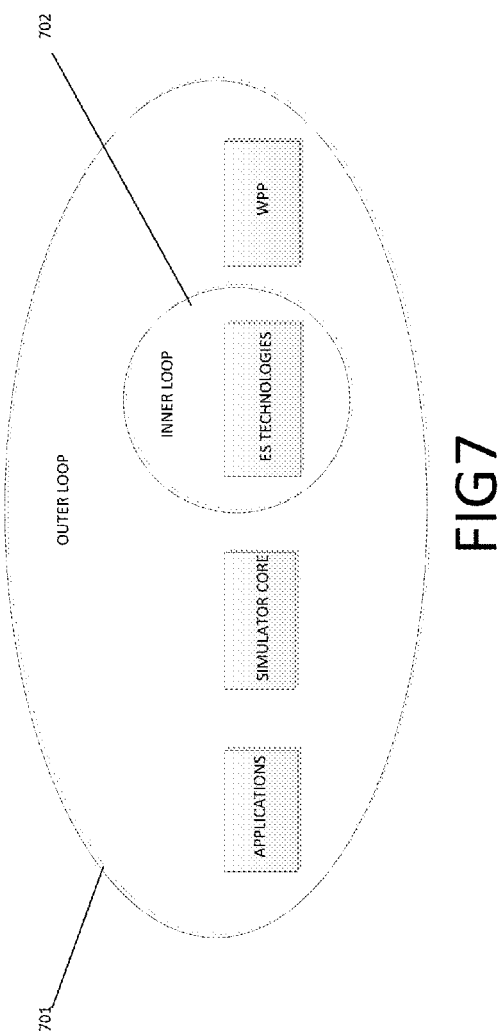
FIG. 7 shows different time steps applicable to particular blocks of the simulator.

As illustrated in FIG. 7, one time step may be provided for a first set of blocks, and the second time step may be used for a second set of blocks. The first set of blocks 701 (Outer Loop) may include the Applications block, the simulator core block and the WPP. The second set of blocks 702 (Inner Loop) may include the ES Technology block, The different time steps applicable to particular block can be seen in FIG. 7, which shows an example of the multiple time step logic inside the Configurator.

The Configurator System may also be built using switch/enable blocks to disable the execution of any unnecessary blocks depending on the selected combination of Market, ES Technology and ES Application. All the other models are not executed and hence will not be generating any results. This method helps to reduce CPU time and memory consumption.

7) Applications

Examples of applications will be described in more detail below but briefly they may include:

ESS for Forecast Accuracy Improvement. The goal is to charge/discharge the ES system such that actual production gets closer to forecasted production (and economic penalties on the power plant are thus lowered).

ES for Storing Curtailed Productions. Grid capacity constraints enforce Wind Park production well below wind potential; i.e., production is curtailed. The goal is to use the ES to store the "curtailed" production (at least partially) and release it later when grid capacity allows and/or energy prices are convenient.

ES for Production Shift. Hour-to hour variation of energy spot-prices can be very large. The goal is that the ES stores wind production when spot-prices are low and sells it when spot-prices are high, this is also known as energy arbitrage.

ES for Capacity Firming. The firm capacity application commits to provide a particular power output for a specific period of time. The power level and time are committed to a day ahead of when the power is delivered. Because of harsh penalties for not providing the committed firm capacity, ES capacity must be maintained to ensure it can be provided even if there is no output from the wind plant.

As shown in FIG. 4, the Application models 402 are divided into two constituent parts: the Application Control Law (ACL) 403 and Revenue Calculations 404 sub-systems. Each one of these two sub-systems contains one block 405a-405c for every market that can be assessed by the configurator, and each of which in turn incorporates a specific block for various individual and combinatorial applications 406a-406f.

The ACL block 403 calculates the initial per unit power reference for the ESS, which provides a rating of the energy storage of the battery unit, and follows a generator convention with positive value taken as the discharging signal for the battery, negative value being the charging for the battery and zero value to place the battery on hold. This block may only consider the market price data to compute the charge/discharge/hold signal to the battery. It also assumes the availability of wind which will be required while charging the battery.

The Revenue block 404 calculates the revenue obtained by participating in the specific application, or in other words operating the WPP in accordance with the application parameters, for the specific time step. This makes use of the actual charge/discharge power of the battery to calculate the revenues and penalties for the application.

The ACL block also contains an additional limiting logic block. The limiting logic block limits the output of a signal from a control perspective, for example if the output is at a range above/below the limit then the limiting logic block will only allow an output of the maximum/minimum set point. The limiting logic block restricts the charging part of initial power reference signals provided by the individual applications to the wind speed capability for the specific time step. In particular, the limiting logic block is arranged to control the battery SOC value such that it cannot exceed the maximum power rating of the battery, or the maximum available wind power.

Specific examples of Application models will now be described. This includes the initial Application Control Law (ACL) and Revenue model based on existing market rules, or grid codes, developed in the Matlab/Simulink model. In the case of some applications, such as Grid Frequency Regulation (GFR), the models developed are unique for each market or grid. For other applications, the models for the different markets are unchanged but the parameters used for simulations are different.

The six ES Applications discussed below are: Time-Shifting, Transmission Curtailment, Grid Frequency Regulation, Combination of Time-Shifting and Transmission Curtailment, Forecast Accuracy and Firm capacity. These ES Applications are discussed for three different example markets, and may be applied to any desired market.

Each ES Application model may be implemented in hardware, as an ASIC, or in software preferably containing one or more logic sub-modules, and includes:

Application Control Law
Revenue Model

These are based on the following data series stored in the Markets and Operations Database:

ES Application specific price series data
WPP production capability data
ES Application specific grid series data The design details for the six ES Application models pertaining to the different market areas are discussed below.

7.1) Time Shifting Application

Time shifting (TS) refers to the practice of utilizing electric energy produced by the Wind Power Plant (WPP) during periods of low load demand (typically between 6:00 pm-6:00 am) to charge an ES device with the intention of making the stored electric energy available during periods of high load demand (typically between 6:00 pm-6:00 am) thus, theoretically, commanding higher prices on the wholesale electric spot market.

As this application is based on maximizing a WPP's revenue by taking advantage of price gradients in the wholesale electric spot market, the same application logic (and thus the same model) can be utilized in several different markets.

For TS, revenue is generated by charging the ESS during periods of relatively low electric spot prices and discharging the ESS during periods of relatively high electric spot prices. In order to determine what constitutes relatively low and relatively high electric spot prices, the TS application module identifies electric spot price boundaries based on actual historic and forecasted electric spot prices. These electric price boundaries are used by the TS application module as threshold points to determine if the ESS should either:

Charge (negative revenue during this state);
Discharge (positive revenue during this state); or
Hold.

The actual electric spot price is compared against these boundary points to determine the required charge/discharge/hold state of the ESS. The electric price boundary points are continuously calculated for each time step, preferably based on the statistical parameters derived for a 'shifting window' looking at the electric spot prices using ±30 day's window.

The TS application module may also include a hysteresis band used to ensure that the ESS is not constantly responding with charge/discharge cycles for minor electric spot price deviations. This greatly reduces the total number of operations for the ESS thus increasing its asset life.

The revenue generated by the TS application is then calculated by the revenue module 404.

7.2) Transmission Curtailment Application

In the Transmission Curtailment (TC) application, the Transmission System Operator (TSO) instructs the WPP to curtail electric output, due to some system constraints, to a level below the WPP's production capability. With energy storage, the power generated by the WPP during periods of curtailment is utilized to charge the battery. The stored energy is later discharged when the curtailment signal is lifted by the TSO.

As this application is only dependent on grid signals from the TSO, the same application logic (and thus the same model) can be utilized for any electric market under investigation.

TSO's are tasked with maintaining the reliability of the electric power grid and depending on system conditions may require a WPP to reduce its power output for a period of time. During these periods of 'curtailment', the WPP is forced to produce a fraction of the power it is capable of producing based on prevailing wind conditions.

Figure 9:
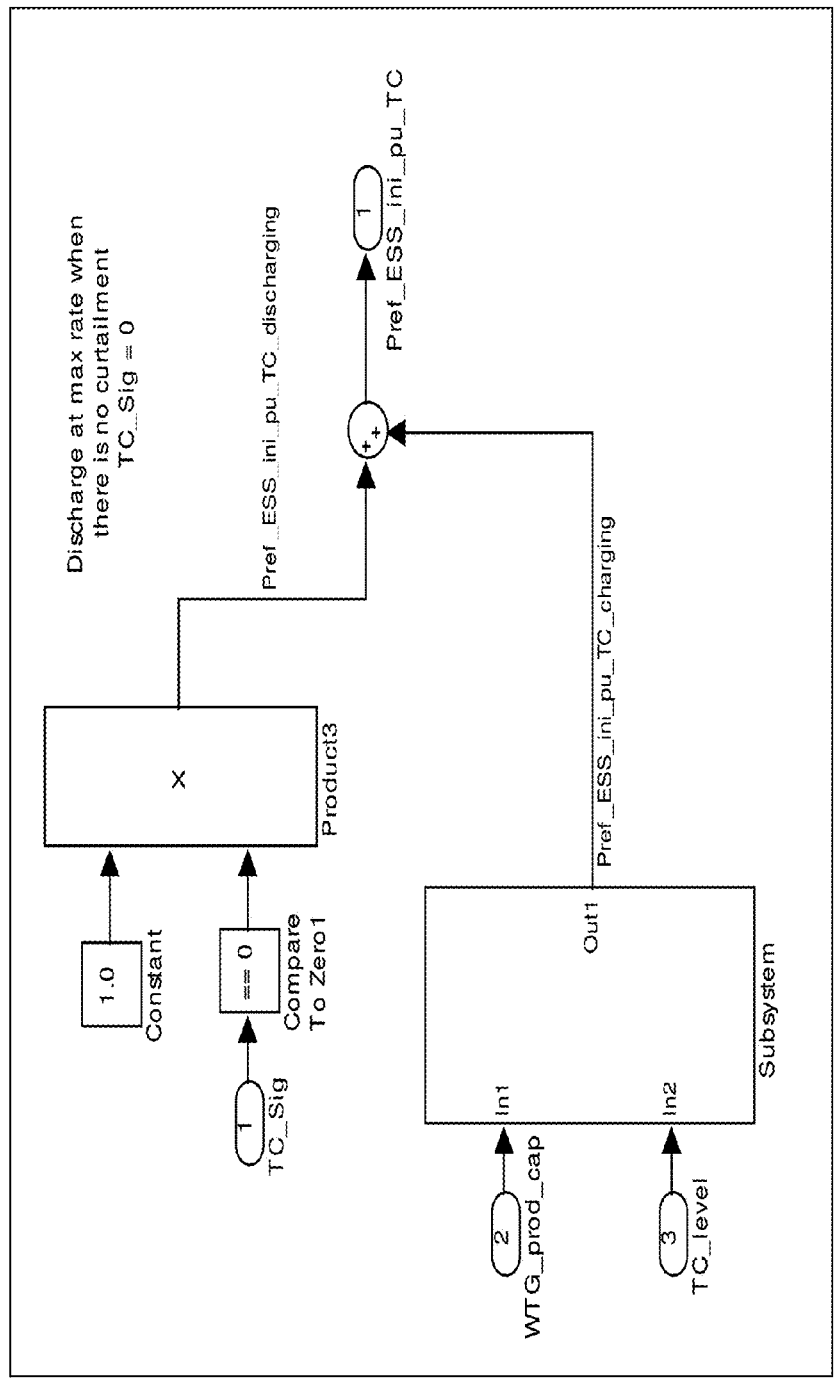
FIG. 9 shows an example of a model for transmission curtailment ACL.

In the Configurator System, the TC application is modelled, in the TC application module, such that the battery is charged when the TSO curtails the WPP. The rate of charge depends on the size of the battery and the level of curtailment. Preferably, when the TSO lifts the curtailment signal and there is no curtailment of the WPP, the TC application is modelled, in the TC application module, such that the battery is discharged at the maximum allowable rate of discharge, subject to the technical restrictions placed by the ES Technology. An example of a simulator model for transmission curtailment ACL is shown in FIG. 9. The simulator may use real world or user generated curtailment grid signals as an input for calculations.

The revenue generated from the TS application is calculated by the revenue module 404; unlike the TS application there is no negative revenue associated with charging the battery. This is because the battery is charged during the periods of curtailment and there is no opportunity cost for the WPP.

7.3) Grid Frequency Regulation Application

Grid Frequency Regulation (GFR) deals with the ability of a power system to maintain a steady acceptable frequency range throughout the power system during normal operating conditions and following a system disturbance. GFR is primarily influenced by load-generation imbalances in the system which can be caused by loss of generation, loss of load, or increase in load causing a deviation from the rated system frequency. It is mitigated through the injection or absorption of real power for a predetermined duration. The manner in which this application is implemented, and the associated financial compensation, differs from one transmission operating region to another.

The ACL for the GFR module may vary for different markets, example models of which are discussed below.

Market 1

In this transmission operating region, there is no ancillary service market for primary frequency response (generators automatically responding to transient system frequency variations based on their frequency-power characteristics). Instead area generation control (AGC), which is the regulation of electric power output from generators within a control area to maintain scheduled system frequency and interchanges with neighbouring control areas, is used. In market 1 the system operator sends AGC pulses to the generators participating in AGC at predetermined intervals requesting either up or down regulation. Bids to participate in the application are submitted by a predetermined time prior to the operating day for a given period of the operating day. Regulation Clearing Prices (RCP) are computed in the real-time for periodic samples.

The Application Control Law (ACL) is used to determine the reference power output for the ESS. For AGC, this is based on the AGC up/down regulation pulse signals provided by the transmission system operator.

Compensation for secondary AGC is in the form of a capacity credit, a credit related to the actual amount of energy delivered/withdrawn to/from the transmission system while a unit is providing AGC and a credit provided to a unit participating in AGC based on the amount of energy not delivered in the wholesale electricity market due to the unit's participation in the AGC market. Should a unit not be able to meet its AGC commitment (either up regulation or down regulation), then the unit is penalized by paying for the unmet AGC regulation for the duration it missed its AGC commitment since the TSO has to procure the unmet AGC regulation from other participating units.

A subsystem within the GFR application module may be provided to determine whether the ESS fully responded to the AGC pulse signal from the TSO. The possible outcomes may be that the down regulation request was not fully met, the up regulation request was not fully met or the up/down request regulation was fully met. If the down regulation request is not fully met the simulator checks the power output of the WPP, at that instance, and determines if the power output can be de-rated to avoid paying the penalty for not meeting AGC commitment. If the up regulation request is not fully met, then the penalty previously discussed will need to be applied. If the up/down regulation request is fully met, then no penalty is applied and just the revenue is calculated.

Market 2

In a similar manner to market 1, market 2 does not have an ancillary service market for primary frequency response but rather AGC is applied. However, unlike market 1, market 2 has a separate AGC market for up regulation and down regulation. Therefore, the financial compensation associated with up regulation and down regulation is different, with the resulting credit being divided into the credit for the actual amount of energy delivered to the transmission system while a unit is providing AGC and the credit for the actual amount of energy withdrawn from the transmission system while a unit is providing AGC. In other respects, the features of market 2 GFR are the same as market 1.

Market 3

Unlike market 1 and market 2, market 3 does have an ancillary service market from primary frequency response as well as AGC. This primary frequency ancillary service market is separated for up regulation and down regulation with different financial compensation rates associated with each regulation type.

The primary frequency ancillary service market for market 3 requires:
  Participating units automatically respond to frequency variations for the scheduled system frequency;
  Bids are submitted on the day prior to the operating day for every specific intervals of the operating day
  RCP Up and RCP Down spot prices are computed in the real-time for samples of a predetermined period.

The ACL is used to determine the reference power output for the ESS. For primary frequency regulation, this is based on determining how severe the system frequency variation is versus the maximum expected system frequency variation.

In market 3, compensation for primary frequency regulation is in the form of payments for "up capacity" credit and "down capacity" credit. Should a unit not be able to meet its primary frequency regulation commitment (either up regulation or down regulation), then the unit is penalized by paying for the unmet frequency regulation at the applicable RCP Up/RCP Down for the duration it missed its frequency regulation commitment since the TSO has to procure the unmet frequency regulation from other participating units.

7.4) Combination of Time-Shifting and Transmission Curtailment Application

As described above, the TSO may instruct the WPP to curtail its electric output due to some system constraints, to a level below the WPP's production capability. With energy storage, the power generated by the WPP during periods of curtailment is utilized to charge the battery. One approach to discharge the stored energy would be to do so immediately after the curtailment signal is lifted. Alternatively, this stored electric energy can be made available during periods of high load demand (typically between 6:00 pm-6:00 am) thus, theoretically, commanding a higher price on the wholesale electric spot market. This combination approach may be modelled in the Configurator System (CS) as a new application module called Transmission Curtailment+Time Shifting (TC+TS).

As this application is based on maximizing a WPP's revenue by taking advantage of price gradients in the wholesale electric spot market and the grid curtailment signals, the same application logic (and thus the same model) can be utilized for any wholesale electric market under investigation.

When the TSO lifts the curtailment signal and there is no curtailment of the WPP, the TC+TS application model is arranged such that additional revenue is generated by charging the ESS during periods of relatively low electric spot prices and discharging the ESS during periods of relatively high electric spot prices. In order to determine what constitutes relatively low and relatively high electric spot prices, electric spot price boundaries are identified based on actual historic and forecasted electric spot prices. These electric price boundaries serve as threshold points that determine if the ESS should either charge (negative revenue during this state), discharge (positive revenue during this state) or hold These electric price boundary points are continuously calculated for each time step based on the statistical parameters derived for a 'shifting window' looking at the electric spot prices based on a ±30 day window. The logic for determining the 'bounds' may be the same as the one used in the Time-Shifting (TS) application, explained above and hence not repeated here.

The revenue generated from undertaking the TC+TS application may be calculated by the revenue module 404.

7.5) Forecast Accuracy Application

Forecast accuracy (FA) is a requirement that may be placed on all electric generating facilities by the respective TSOs to ensure that the real-time output of a generator or power plant meets its scheduled output and results in a financial penalty if outside of an accepted tolerance range for scheduled output.

TSO's require the WPP operators to provide a schedule for the operation of the WPP. The notification period depends on the specific market rules. For example, market 1 requires all generating units that are self-scheduled (price-takers) to inform the ISO of their schedules one hour ahead of the operating period.

The Configurator System (CS) may utilize historical data for wind production capability; spot price etc and as such the Forecast Accuracy ACL back-calculates the real time (RT) WPP Forecast at each time step for given values of WPP Production Capability and RT Forecast Error. If the RT Forecast Error is greater than the TSO RT Error Tolerance, then the forecast accuracy ACL logic will provide a reference signal ($P_{ref}$) to the charge or discharge accordingly. The magnitude of $P_{ref}$ is equal to the difference between the RT Forecast Error and the TSO RT Error Tolerance.

The revenue from FA can be decomposed into two parts; delta payments and delta penalties. Delta payment is the additional positive revenue generated by the FA application as opposed to when FA is not implemented. This additional revenue is generated only when the ESS discharges to provide power to the grid. For example, if the ESS discharges 2 MW in order to meet the RT WPP Forecast, then there is an additional positive revenue generated by the 2 MW discharge. Delta penalty is the difference between the penalty imposed by the TSO while the FA application is implemented and the penalty imposed by the TSO when FA is not implemented.

In case of an ideal battery, where the actual power delivered by the ESS (ESS_actual) is equal to the reference signal from the forecast accuracy ACL ($P_{ref}$), the penalty imposed by the TSO while the FA application is implemented should be zero. However, due to technical constraints imposed by the ES Technology, there could potentially be some difference between ESS_actual and $P_{ref}$. In such instances, the TSO will impose penalties for not meeting the RT WPP Forecast. The penalty may be calculated based on the real-time spot price of energy (RT_LMP) for the hour when the schedule is not met.

7.6) Firm Capacity Application

Firm capacity (FC) is generating capacity which has been scheduled for a specific point in time in the future and is guaranteed to be available at that given time. The FC application allows a WPP, in conjunction with an ESS, to participate in the Day-Ahead Market or an Intra-Day Market by guaranteeing a MW schedule for a future time.

In most market areas, the settlement of the Day-Ahead (DA) Market is performed every day at a set time for the next operating day. As such, participating generators need to provide a MW schedule and a price bid for every hour of the next operating day. WPP's are typically price-takers in the energy market but are required to provide a MW schedule to the concerned TSO. If cleared in the DA Market, these units are obligated to meet their DA MW schedule at the settled spot price. If the TSO requires a generator to deviate from its DA schedule in the real-time, due to system changes or transmission constraints, the generator will be paid the difference between the spot price in the Real Time (RT) or Balancing Market and the spot price in the DA Market.

The forecast of wind speed and WPP Production Capability for the next operating day is determined by Numerical Weather Prediction (NWP) based physical models. Such models are typically used for forecasting in the 12-36 hour range.

The firm capacity ACL in the Configurator System assumes a conservative bidding strategy with the real time WPP Production Capability exceeding the Day-Ahead schedule bid (DA_bid) of the WPP 99% of the time. This strategy is implemented in order to minimize the probability of incurring a penalty for not meeting the DA schedule.

Regardless of whether the WPP participates in the DA Market, TSO's require the WPP operators to provide a real-time schedule for the operation of the WPP. The notification period depends on the specific market rules. For example, market 1 requires all generating units that are self-scheduled (price-takers) to inform the ISO of their schedules one hour ahead of the operating period. The firm capacity ACL back-calculates the RT WPP Forecast at each time step for given values of WPP Production Capability and RT Forecast Error.

The values for DA_Forecast_Error are calculated accordingly by the module.

The ESS_Pref, when not participating in FC is required later in the revenue section. This is because the revenue from FC is essentially the incremental revenue from participating in the DA Market.

The revenue from FC can be calculated in two parts by the revenue module 404:

Delta Payments: This is the incremental revenue generated by the FC application (participation in the DA Market) as opposed to when FC is not implemented. The revenue generated by participating in FC is calculated as follows:

Delta Penalty: This is difference between the penalty imposed by the TSO for not meeting the RT schedule while the FC application is implemented and the penalty imposed by the TSO for not meeting the RT schedule when FC is not implemented.

The TSO will impose penalties for not meeting the RT WPP Forecast. The penalty is calculated based on the real-time spot price of energy (RT_LMP) for the hour when the schedule is not met. The FC penalty may be similar to the FA penalty such that it is calculated for each time step and then is aggregated for the hour. If there is no penalty at any time step during an hour, the aggregate penalty for the hour would be zero and the counter is reset. The penalty is associated with violation of the TSO RT Error Tolerance and is modelled as bi-directional.

8) ESS Models

The energy storage module, or battery model module, contains a model of the storage technology selected to use as, or within, the energy storage system. The energy storage technology can be selected by the user or can be suggested by the ES technology selector module 104. Inputs to the battery module 401 may include commanded/required ES power, external temperature, curves or data characterizing the battery (such as life time versus depth of cycles, capacity degradation over lifetime, and temperature). Outputs from the battery model module include the actual ES power, state of charge (SOC) and remaining life.

The purpose of this section is to describe the design of example ES Technology models that may be included in the Configurator system. This includes the phenomena of each technology to be modelled, the assumptions behind these phenomena, as well as the realization of these phenomena in the simulation core.

As described above, the ES technology selector 204, which may produce an initial scorecard, may be used as a filter to choose the most promising technologies to be studied in more depth. Part of the additional studies is to model those technologies and simulate their performance for a number of applications, markets, and wind conditions. The main technology discussed in this section is the Lithium Ion (Li-ion) battery. One or more other types of energy storage technology could be modelled in embodiments of the present invention, including other types of battery such as Sodium Sulphur (NaS) batteries or Vanadium Redox batteries (VRB), or any other type of storage including mechanical arrangements such as Flywheels.

Each model preferably captures the following phenomena of the ESS where applicable:
  Efficiency variation and the affecting factors
  Self discharge and the affecting factors
  Capacity degradation with time and the affecting factors
  Remaining life degradation with time and the affecting factors The affecting factors normally include:
The state of charge (SOC)
The charge/discharge cycle number (N)

The ESS models accept and process various variables when initializing the model, when each simulation time step is performed, and may also output various variables after each simulation time step.

8.1) ESS Technology Example 1—Li-Ion Battery

A Li-Ion battery model will be described for use in the ES Technologies module 408. Many of the functionalities outlined for the Li-Ion battery may be used for different ESS technologies, such as the ones mentioned above, requiring only parameter changes to capture the characteristics of a different technology.

The most significant phenomena and parameters of a Lithium Ion (Li-Ion) battery, which affect the simulation results of the Configurator, include battery life, efficiency, capacity degradation and CAPEX. In order to simulate the performance of the battery and its use in the Configurator, these phenomena are modelled based on some assumptions.

Cycle Life

Batteries have a finite life due to the occurrence of unwanted chemical/physical changes to the active materials of which they are made. These changes are usually irreversible and they affect the electrical performance of the cell. There are three main concepts related to battery life:

Battery cycle life (CL) is defined as the number of complete charge/discharge cycles a battery can perform before its nominal capacity falls below an agreed amount, usually 80%, of its initial rated capacity. An alternative measure of cycle life is based on the internal resistance of the cell. In this case the cycle life is defined as the number of cycles the battery can perform before its internal resistance increases by an agreed amount, usually 1.3 or 2 times its initial value when new.

Battery shelf life is the time an inactive battery can be stored before it becomes unusable, usually considered as having below 80% of its initial capacity.

Battery calendar life is the elapsed time before a battery becomes unusable whether it is in active use or inactive as above.

The present document is focused on cycle life (CL). CL is affected by the charge/discharge current (C-rate or I), depth of discharge (DOD), temperature (T), as well as by other conditions such as humidity (H), average State of Charge (SOC). That is:

$$CL = f(DOD, T, H, I, SOC)$$

Calendar life is also included as an output in the models. However, most simulations will be run for a fraction of the calendar life. Therefore the decision to replace the battery based on calendar life may be made in the post processing stage.

Efficiency

During the charge/discharge process, energy losses will exist in the battery, which are caused by the internal resistance and the self discharge. Both are influenced by the temperature. The energy losses on the internal resistance can be calculated as:

$$E_1 = \int_0^t i^2(t) \cdot R_{int} \, dt$$

The energy loss due to the self discharge can be calculated by:

$$E_2 = \int_0^t \frac{v^2(t)}{R_{sd}} \, dt$$

Therefore, the roundtrip efficiency of the battery can be calculated by:

$$\eta = \frac{E_{discharge}}{E_{charge}} = \frac{E_{charge} - (E_1 + E_2)}{E_{charge}} = f(T, i, v)$$

Where:
T—Temperature [oC]
$R_{int}$—internal resistance of battery [$\Omega$]
i(t)—instant charge or discharge current (charge/discharge current) [A]
$R_{sd}$—equivalent resistance between the battery terminals due to the self discharge [$\Omega$]
v(t)—instant voltage at the battery terminals (depends on the SOC) [V]
$E_{discharge}$—energy discharged from the battery during one full discharge cycle [W]
$E_{charge}$—energy charged into the battery during one full charge cycle [W]
E1—energy losses on the battery internal resistance [W]
E2—energy losses due to the self discharge [W]

Because voltage depends on the SOC, it follows that the efficiency depends on the temperature, the charge/discharge current, and the SOC:

$$\eta = f(T, I, SOC)$$

Capacity Degradation

The "capacity degradation" of batteries refers to the decrease of battery capacity as the number of charge-discharge cycles increases. The mapping from DOD to CL is "linear". That is, the CL corresponding to any generic SOC profile can be approximated by adding all the CL associated to all the different DODs this profile can be decomposed into.

Capacity degradation can be directly estimated from experimental data. Therefore:

$$E_{max} = f(Cycles, DOD)$$

Efficiency $\eta$ Assumption 1: The internal resistance (Rint) and the self discharge resistance (Rsd) are impacted by the operating temperature of the battery as well as the number of charge/discharge cycles. However, the changes observed are relatively small and induce negligible losses when compared to the charge/discharge energy amount. Consequently, these losses are neglected for the sake of simplicity of the model. Furthermore, by assuming that the terminal voltage of the battery remains relatively constant the efficiency of the battery remains constant during all its life, that is:

$$\eta = \text{Constant}$$

Based on the above, the main components in the Li-Ion model may be considered to be: cycle-life, capacity degradation, and efficiency. This section discusses the detailed design of all components that make up the Li-Ion model.

Figure 10:
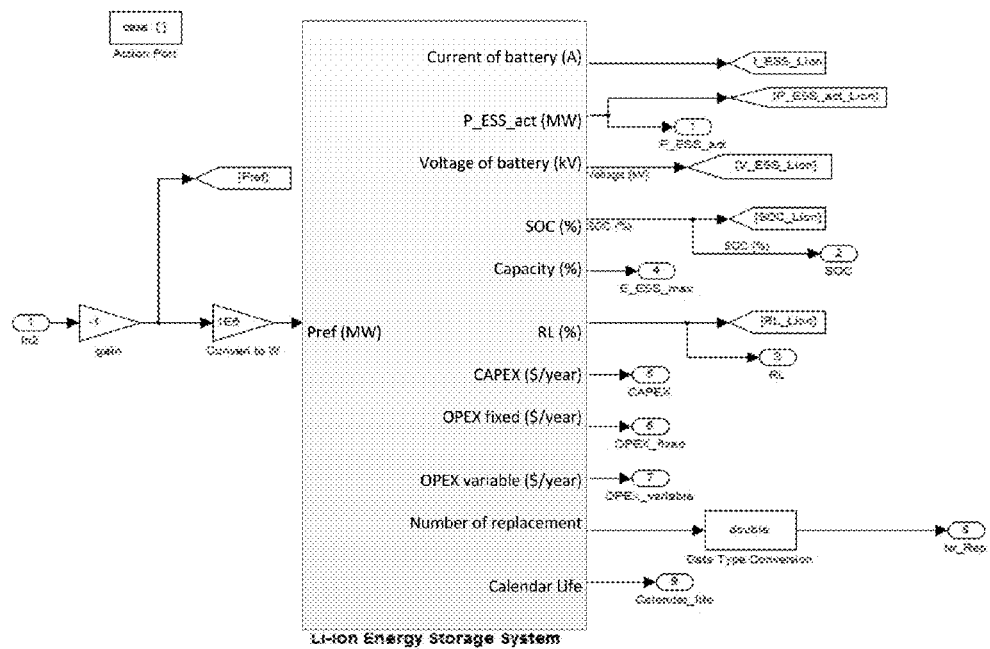
FIG. 10 shows the highest layer of a Li-Ion Battery simulation model.

FIG. 10 shows the highest layer of the Li-Ion Battery simulator model. The outputs are the signals defined in the requirement specifications as required signals. The only input shown in the model is the power reference. Other input parameters, also defined in the requirement specifications may be initialized using an m-file before running the simulation.

The simulator model may include separate blocks for Capacity Fading, Remaining Battery Life, Charge Limiter, and CAPEX & OPEX blocks. These blocks will be discussed in detail below. Other important functionalities that may not be included in separate blocks are the efficiency and power reference limiter.

The power reference limiter is arranged to perform the function of limiting the reference power to be between P_max and −P_max. This prevents the model from providing or absorbing more power than its rating.

The efficiency is applied in two places: once before the power is integrated and added to the state of charge of the battery, and once before the power is provided as an output to the Configurator System. There is an option to set the charge and discharge efficiencies separately, although preferably they are equal. According to the assumptions described earlier, the efficiency is assumed to be constant and therefore the one way efficiency is also assumed to be constant.

When charging, the battery will see less power than is applied by the controller, due to battery and PCS losses. Therefore, to account for the losses, the power reference is multiplied by the charge efficiency, reducing the power that will be integrated and added to the SOC.

To account for losses during discharge, the battery must supply more power than is measured at the high side of the transformer. Therefore the power reference is divided by the discharge efficiency, increasing the power requirement to be supplied by the battery.

To determine which signal should be selected, charge or discharge, a switch is controlled by the power reference signal. When the signal is positive the charge signal (power reference multiplied by the charge efficiency) is passed through, when the signal is negative, the discharge signal (power reference divided by the discharge efficiency) is passed through.

A charge limiter block may be provided in the model, arranged to provide additional protection for the battery by preventing the battery from overcharging and/or over-discharging. Three inputs are required to perform the necessary calculations, the power reference, voltage, and capacity. The power capability limits of the battery are calculated for the next time step using the capacity and the SOC.

The power reference is then passed through a dynamic limiter arranged not to allow commands that will overcharge or over-discharge the battery. If the power reference falls outside the acceptable limits, it is set to the limits, which ensure the SOC limits are not violated. The resulting power reference is passed to the SOC block, which updates the SOC based on the new power reference. The power reference is also divided by the voltage (calculated in another block) to provide the current required to meet the power reference. The power reference, current, and SOC are provided as outputs.

The SOC block is preferably inside the charge limiter block. The SOC block updates the SOC for each time step. The SOC block receives two inputs from the model, the power reference and the battery capacity. The initial energy stored in the battery is calculated based on the initial capacity of the battery as well as the initial SOC. A self-discharge is subtracted from the power reference each time step. Li-Ion batteries do not have a significant self-discharge, however it is included in the model for other battery types. A switch is included to stop the self-discharge if the SOC is reduced to 0. The power is integrated and added to the initial energy stored in the battery. To convert to percentage, the sum is divided by the energy capacity of the battery and multiplied by 100. The energy capacity of the battery is recalculated each time step by the capacity signal.

A capacity degradation block may also be provided, being arranged to calculate the reduction in capacity based on the remaining life of the battery. The function used may be derived from regression analysis on a capacity degradation curve obtained from experimental values.

Figure 11:
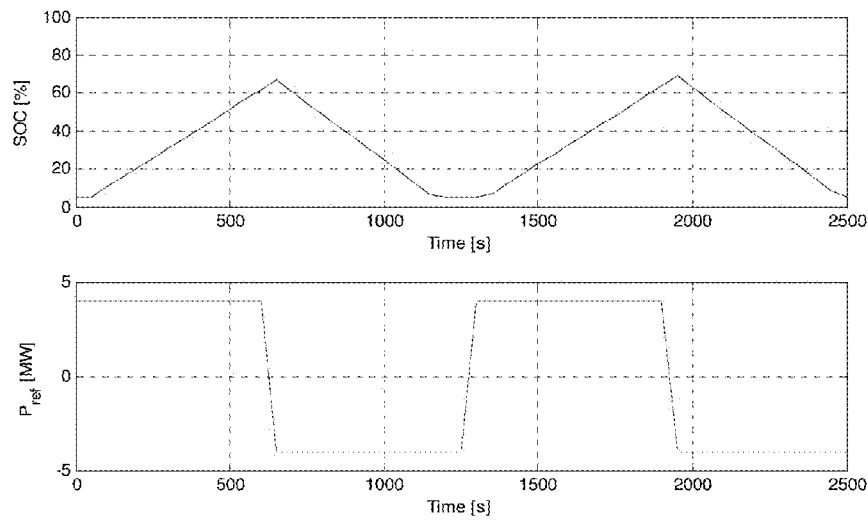
FIG. 11 shows, on top, SOC versus time for a battery and, on bottom, the power flowing into or out of the battery versus time.
Figure 12:
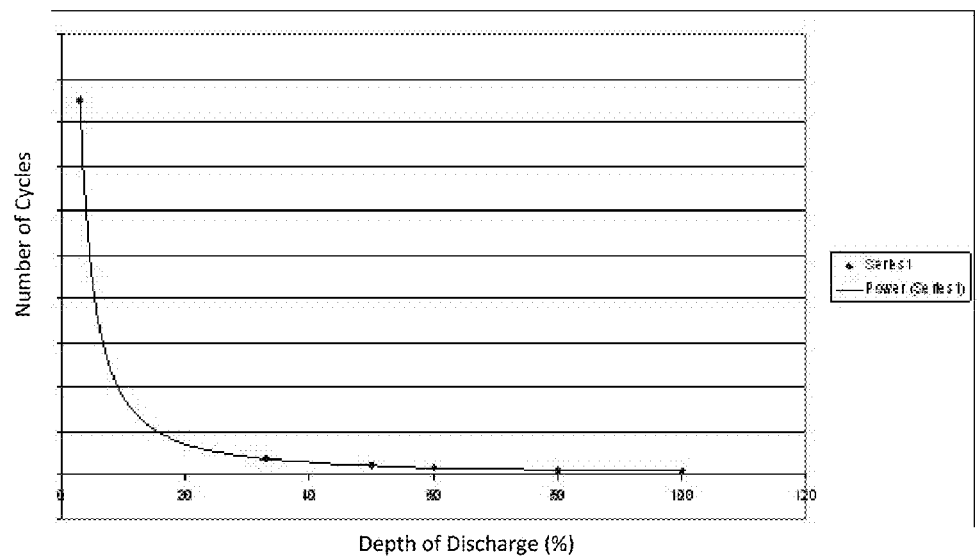
FIG. 12 shows the regression equation of the relationship between cycle life and degree of discharge.

To calculate the used life of the battery, the depth of discharge is calculated for each half cycle. FIG. 11 shows, on top, SOC versus time for a battery and, on bottom, the power flowing into or out of the battery versus time. From FIG. 11 it can be seen that every time the power reference crosses zero, the SOC is either at a maximum or minimum. This relationship is used to determine when a full half cycle has been completed (a maximum to a minimum or vice versa). First a maximum or minimum of the SOC is saved. The difference between the current SOC value and the saved max/min is calculated and passed through a function block, preferably at every time step. The function calculates the life used by that half cycle based on predetermined data, such as a plot of depth of discharge vs number of cycles such as the one shown in FIG. 12.

Preferably, when the power reference indicates that the current point is also a max/min by crossing zero, a switch is triggered, passing the output of the function to an integrator. The switch only allows the function output to pass to the integrator when a min/max is reached, capturing only the half-cycle DOD.

The output of the integrator is the total used life of the battery up to the current time step of simulation. The remaining logic in the block calculates the remaining life of the battery and number of replacements based on the initial life of the battery and the total used life of the battery. These signals (Remaining Life (RL) and replacements) are provided as outputs for use in the rest of the model.

A CAPEX and OPEX block is arranged to calculate the costs associated with purchasing and using the Lithium Ion battery. The total costs are the sum of the CAPEX and OPEX costs as shown in the following formula:

$$Costs = CAPEX + OPEX$$

The CAPEX costs include three components, an energy component, a power component, and a balance of plant component. The formula used to calculate the total capital costs for the battery is:

$$CAPEX = P\_max * CAPEX\_kw + E\_max * (CAPEX\_kwh + BOP\_kwh)$$

The OPEX costs consist of a fixed cost based on the power rating of the battery, and a usage cost based on energy usage. The usage costs include only the energy discharged from the battery. The energy used to charge is not included. The formula used to calculate the OPEX is:

$$OPEX = P\_max * OPEX\_kw + OPEX\_kwh * \int_0^T P_{discharge} \cdot dt$$

Where:

| Parameter Name | Description |
| --- | --- |
| CAPEX | costs of purchasing battery [$] |
| OPEX | costs of operating battery [$] |
| P_max | power rating of battery [kW] |
| E_max | energy rating of battery [kWh] |
| CAPEX_kW | cost of power rating of battery [$/kW] |
| CAPEX_kWh | cost of energy rating of battery [$/kWh] |

-continued

| Parameter Name | Description |
|---|---|
| BOP_kWh | cost of additional components required for operation of the system [$/kWh] |
| OPEX_kW | fixed cost for operating the battery [$/kW] |
| OPEX_kWh | Variable cost of operation, based on energy usage [$/kWh] |
| $P_{discharge}$ | power supplied from the battery to the grid [W] |

A voltage calculation block may be provided in the model. This block may be a modified version of a battery model that uses only the battery State-Of-Charge (SOC) as a state. This model, composed of a controlled voltage source in series with a resistance, does not concern the exact electrochemical process inside the battery. It simply simulates the external electrical performance of battery. The model's parameters may be extracted from a manufacturer's discharge curve. Therefore, it can accurately represent different types of battery, based on their discharge curves.

Figure 13:
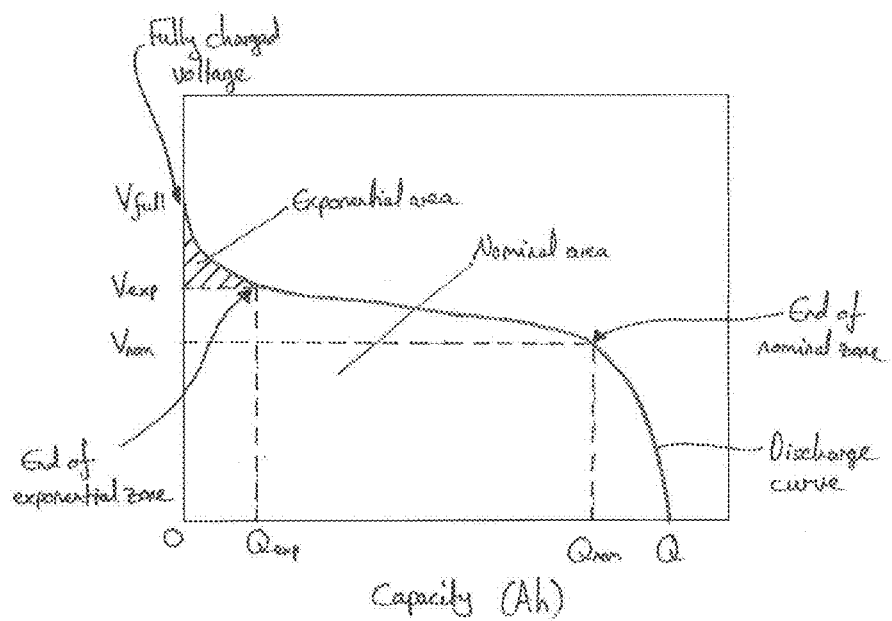
FIG. 13 shows a typical discharge characteristic, for a rechargeable battery.

The discharge model of the battery may be based on predetermined discharge data. FIG. 13 shows a typical discharge characteristic, for a rechargeable battery; such a curve can represent accurately the voltage dynamics when the current varies and takes into account the open circuit voltage (OCV) as a function of SOC. Terms concerning the polarization voltage and the polarization resistance are added to better represent the OCV behaviour.

The battery voltage obtained is given by:

$$V_{batt} = E_0 - \underbrace{K \frac{Q}{Q-it} \cdot it}_{Pol.Voltage} - R \cdot i + A \cdot \exp(-B \cdot it) - \underbrace{K \frac{Q}{Q-it} \cdot i^*}_{Pol.Resistance}$$

Where:

| Parameter Name | Description |
|---|---|
| $V_{batt}$ | battery voltage [V] |
| $E_0$ | battery constant voltage [V] |
| K | polarization constant [V/Ah] or polarization resistance [Ω] |
| Q | battery capacity, i.e., $E_{max}$ of storage [Ah] |
| it | $\int i \cdot dt$ = actual battery charge [Ah] |
| A | exponential zone amplitude [V] |
| B | exponential zone time constant inverse [Ah$^{-1}$] |
| R | internal resistance [Ω] |
| i | battery current [A] |
| i* | filtered current [A] |

The particularity of this model is the use of a filtered current (i*) flowing through the polarization resistance. In fact, experimental results show a voltage slow dynamic behaviour for a current step response. This filtered current solves also the algebraic loop problem due to the simulation of electrical systems in some simulation software. Finally, the OCV varies non-linearly with the SOC. This phenomenon is modelled by the polarization voltage term.

9) Post Processing

The post processing module takes the simulator output and generates a ranking of ES technology/application pairs for a given ES technology size. In particular, the post processing module may calculate the NPV and/or yearly cash flow data for each ES technology considered. The post processor may take the simulation results and forecast data for particular periods and project them to a longer predetermined period, allowing the NPV for the longer period to be determined. The post processor may also determine when an ES device is likely to need replacing throughout the longer predetermined period.

A final score card (FSC) may be based on the highest generated NPV for a predetermined cycle period for the combination of ES Technology, Application, and various ES sizes of the studied market. A value other than NPV may be used, the value being indicative of the efficiency and/or cost of operating a WPP with the ES Technology being considered.

As an example, referring to FIG. 14, for market 1, it may be determined through the running of the Configurator that the optimal NPV that can be expected for the investigated technology (Li-ION) and application (TS) for various sizes is NPV_TS_A1, where size A1 is determined, by the sizing optimization module, to be the best ES size to achieve the optimal NPV value.

As a result of the simulator outputs and the post processing to determine the most efficient or cost effective VPP, being a combination of a simulated ESS technology and simulated or real WPP, a corresponding real world wind power plant may be constructed, or the appropriate ESS technology may be installed at an existing WPP.

Embodiments of the present invention have been described in relation to a virtual wind power plant, for applications in which it is desired to determine the likely operating profit for a wind power plant/storage technology pair in a given location and to compare this with other pairs. It will be appreciated that embodiments of the invention could be extended to other renewable energy power plants being coupled to energy storage technologies. For example, tidal or wave power plants may benefit from implementations of the presents invention.

Embodiments of the invention have been described in relation to a computer system. It should be appreciated that a configurator system may be provided on a distributed or networked system in which elements, such as the simulation engine, MOD database, application models or ESS models are remote from the user terminal.

We claim:

1. A computer-implemented method for determining a configuration for a renewable energy power plant having a power output rating and operatively connected with an electrical grid, the power plant comprising one or more generator devices and one or more energy storage devices operating according to a selected one of a plurality of operating applications, the method comprising:

receiving, in a computer as an input, data indicative of the power output rating of the power plant;

receiving, in the computer as an input, data indicative of a location of the electrical grid;

determining, based on the received data, a plurality of distinct pairings, each pairing including one of the one or more energy storage devices and one of the plurality of operating applications, the plurality of distinct pairings collectively reflecting a plurality of possible combinations of the one or more energy storage devices with the plurality of operating applications;

upon determining that at least a first of the one or more energy storage devices has requirements that are incompatible with operating requirements for the electrical grid at the location, removing, using the computer, the first energy storage device from being included in the plurality of distinct pairings;

determining, using the computer, for each pairing of the plurality of distinct pairings, a respective profitability value indicating a profitability of operating the power plant according to the selected operating application and using the selected energy storage device; and ranking the pairings according to the respective profitability values.

2. The method of claim 1, wherein determining a profitability value for each pairing includes determining a plurality of profitability values for each pairing, each of the plurality of profitability values corresponding to a different capacity value for the selected energy storage device, and wherein ranking the pairings further includes ranking the capacity values.

3. The method of claim 1, further comprising:
upon determining that at least one of the plurality of operating applications has operating requirements that are incompatible with operating requirements for the electrical grid at the location, removing the at least one operating application from inclusion in determination of the plurality of distinct pairings.

4. The method of claim 1, further comprising selecting the energy storage device corresponding to a largest profitability value for a particular operating application.

5. A computer-implemented method for comparing, using a simulator, a plurality of energy storage systems for a renewable energy power plant having a power output rating, the simulator including a calculation module simulating operation of the power plant using pairings of a selected energy storage system (ESS) model with a selected application model, the ESS model selected from a plurality of ESS models representing different types of ESS, and the application model selected from a plurality of application models and corresponding to a selected operating application by which the power plant and the selected ESS model are operated, the method comprising:
receiving data indicative of the power output rating of the power plant;
receiving data indicative of a location of the power plant;
determining, prior to performing a simulation of operation of the power plant for a plurality of distinct pairings that collectively reflect a plurality of possible combinations of the plurality of ESS models with the plurality of application models, whether the ESS types can meet the requirements of the selected application model by comparing requirements of the application model with predefined ESS parameters and removing any incompatible application models from being included in the pairings used for the simulation;
for the plurality of distinct pairings:
performing, using the calculation module and based on the power output rating, a simulation of operation of the power plant with the energy storage system according to the selected application model; and
generating one or more simulation results indicative of the performance of the pairing; and
ranking, based on the generated simulation results, the performance of the pairings.

6. The method of claim 5, wherein the received data includes data obtained from an existing renewable energy power plant or data determined from a location-dependent parameter.

7. The method of claim 5, further comprising:
calculating, using the simulator and for each of the plurality of distinct pairings, a parameter indicative of a profitability of the pairing,
wherein ranking the relative performance of the pairings is based on the calculated profitability parameter.

8. The method of claim 7, wherein the parameter includes a net present value (NPV) of operating the power plant according to the corresponding pairing.

9. The method of claim 7, further comprising selecting the pairing corresponding to a largest profitability parameter.

10. The method of claim 8, further comprising generating a tabular ranking of each pairing based on the respective NPV.

11. The method of claim 5, further comprising
performing a plurality of simulations for at least one pairing of the plurality of distinct pairings using different capacity values for the selected ESS model, and ranking the results of the plurality of simulations.

12. The method of claim 11, wherein an optimum ESS capacity is determined by:
calculating a profitability of each capacity value for the at least one pairing, and
ranking the capacity values according to the profitability.

13. The method of claim 5, further comprising:
receiving data indicative of a location of the power plant;
determining, prior to performing the simulation of operation of the power plant for the plurality of distinct pairings, whether the plurality of application models are compatible with grid code requirements for the location and a type of the power plant; and
removing any incompatible application models from inclusion in the pairings used for the simulation.

14. The method of claim 13, wherein the determination of compatibility is based upon one or more of price information, grid information, and local wind information.

15. The method of claim 5, wherein the operating applications include one or more of Time-Shifting, Transmission Curtailment, Grid Frequency Regulation, Combination of Time-Shifting and Transmission Curtailment, Forecast Accuracy, and Firm Capacity.

16. The method of claim 5, wherein the simulator is provided as a modular arrangement, with the plurality of ESS models, data related to properties of one or more renewable energy power plants, and the plurality of application models provided as separate modules, the method further comprising:
performing simulation of at least one of the separate modules with a different time rate than the other modules.

17. The method of claim 16, wherein an ESS module simulation corresponding to the plurality of ESS models is run at a faster rate than the other modules.

18. The method of claim 5, wherein the renewable energy power plant includes a wind power plant comprising a plurality of wind turbine generators.

19. An apparatus for determining a configuration for a renewable energy power plant having a power output rating and operatively connected with an electrical grid, the power plant comprising one or more generator devices and one or more energy storage devices and operating according to a selected one of a plurality of operating applications, the apparatus comprising:
an input terminal receiving data indicative of the power output rating of the power plant and data indicative of a location of the electrical grid;
a processor coupled with the input terminal, wherein the processor:
determines, based on the received data, a plurality of distinct pairings, each pairing including one of the one or more energy storage devices and one of the plurality of operating applications, the plurality of distinct pairings collectively reflecting a plurality of possible combinations of the one or more energy storage devices with the plurality of operating applications;

upon determining that at least a first of the one or more energy storage devices has requirements that are incompatible with operating requirements for the electrical grid at the location, removes the first energy storage device from being included in determination of the plurality of distinct pairings;

determine determines, for each pairing of the plurality of distinct pairings, a respective profitability value indicating a profitability of operating the power plant according to the selected operating application and using the selected energy storage device; and ranks the pairings according to the respective profitability values; and a memory coupled with the processor receiving the ranking of the pairings.

20. The apparatus of claim 19, wherein the processor:
determines, using received data and for each distinct pairing, profitability values indicating a profitability of operating the power plant according to the selected operating application and for a plurality of different capacity values for the selected energy storage device; and ranks the pairings and capacity values according to the profitability values.

21. The apparatus of claim 19, wherein the input terminal receives data indicative of a location of the electrical grid, and wherein the processor:
upon determining that at least one of the plurality of operating applications has operating requirements that are incompatible with operating requirements for the electrical grid at the location, removes the at least one operating application from inclusion in determination of the plurality of distinct pairings.

22. The apparatus of claim 19, wherein the processor selects the pairing corresponding to a largest profitability value.

* * * * *